(12) United States Patent
Lee et al.

(10) Patent No.: US 11,791,447 B2
(45) Date of Patent: Oct. 17, 2023

(54) DISPLAY DEVICE

(71) Applicant: Samsung Display Co., LTD., Yongin-si (KR)

(72) Inventors: Hyun Wook Lee, Suwon-si (KR); Tae Hee Lee, Asan-si (KR); Jong Chan Lee, Suwon-si (KR); Woong Hee Jeong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 129 days.

(21) Appl. No.: 17/196,358

(22) Filed: Mar. 9, 2021

(65) Prior Publication Data

US 2021/0336108 A1 Oct. 28, 2021

(30) Foreign Application Priority Data

Apr. 24, 2020 (KR) .......................... 10-2020-0049820

(51) Int. Cl.
| | |
|---|---|
| *H01L 33/60* | (2010.01) |
| *H01L 23/00* | (2006.01) |
| *H01L 33/62* | (2010.01) |
| *H01L 25/075* | (2006.01) |

(52) U.S. Cl.
CPC .............. *H01L 33/62* (2013.01); *H01L 24/24* (2013.01); *H01L 24/32* (2013.01); *H01L 24/73* (2013.01); *H01L 25/0753* (2013.01); *H01L 33/60* (2013.01); *H01L 2224/24011* (2013.01); *H01L 2224/24051* (2013.01); *H01L 2224/24226* (2013.01); *H01L 2224/32057* (2013.01); *H01L 2224/32225* (2013.01); *H01L 2224/73217* (2013.01)

(58) Field of Classification Search
None
See application file for complete search history.

(56) References Cited

U.S. PATENT DOCUMENTS

| | | | |
|---|---|---|---|
| 2014/0197431 A1* | 7/2014 | Oka | ......................... H01L 33/50 257/88 |
| 2020/0075667 A1* | 3/2020 | Lee | ....................... H01L 27/156 |
| 2021/0111323 A1 | 4/2021 | Kim et al. | |
| 2021/0265329 A1 | 8/2021 | Woo et al. | |

(Continued)

FOREIGN PATENT DOCUMENTS

| | | |
|---|---|---|
| JP | 2014-123583 | 7/2014 |
| KR | 10-2018-0055021 | 5/2018 |
| KR | 10-2020-0010706 | 1/2020 |

(Continued)

*Primary Examiner* — Telly D Green
(74) *Attorney, Agent, or Firm* — KILE PARK REED & HOUTTEMAN PLLC

(57) ABSTRACT

A display device includes a first electrode disposed on a substrate, a second electrode disposed on the substrate and spaced apart from the first electrode, at least one light-emitting element extending in a direction, disposed between the first electrode and the second electrode, and electrically connected to the first electrode and the second electrode, and an insulating pattern layer disposed on the first electrode and the second electrode, the insulating pattern layer including a fixer disposed on at least part of the at least one light-emitting element, and a barrier surrounding the at least one light-emitting element.

20 Claims, 25 Drawing Sheets

(56) References Cited

U.S. PATENT DOCUMENTS

2021/0335765 A1\* 10/2021 Lee .................... H01L 27/1248
2021/0336108 A1\* 10/2021 Lee ........................ H01L 24/32

FOREIGN PATENT DOCUMENTS

| KR | 10-2020-0013190 | | 2/2020 |
| KR | 20200028065 A | \* | 3/2020 |
| KR | 20200034904 A | \* | 4/2020 |
| KR | 10-2021-0031588 | | 3/2021 |

\* cited by examiner

ED : ED_G,ED_D
RMT1 : RMT11,RMT12
RMT12 : RMT12a,RMT12b
RMT2 : RMT21,RMT22
RMT22 : RMT22a,RMT22b

DISPLAY DEVICE

CROSS REFERENCE TO RELATED APPLICATION(S)

This application claims priority to and the benefit of Korean Patent Application No. 10-2020-0049820 under 35 U.S.C. § 119, filed in the Korean Intellectual Property Office (KIPO) on Apr. 24, 2020, the entire contents of which are incorporated herein by reference.

BACKGROUND

1. Technical Field

The disclosure relates to a display device and a method of manufacturing the same.

2. Description of the Related Art

Display devices have increasingly become of importance with the development of multimedia, and various types of display devices, such as an organic light-emitting diode (OLED) display device, a liquid crystal display (LCD) device, or the like, have been used.

A display device, which is a device for displaying an image, includes a display panel such as an OLED display panel or an LCD panel. The display panel may include light-emitting elements such as light-emitting diodes (LEDs), and the LEDs may be classified into OLEDs using an organic material as a fluorescent material and inorganic LEDs (ILEDs) using an inorganic material as a fluorescent material.

ILEDs, which use an inorganic semiconductor as a fluorescent material, are durable even in a high-temperature environment and have a higher blue light efficiency than OLEDs. To address the limitations of conventional ILEDs, a transfer method using dielectrophoresis (DEP) has been developed. Research has been continued on ILEDs, which are more durable and efficient than OLEDs.

SUMMARY

Embodiments of the disclosure provide a display device having an improved emission efficiency and having a reduced process dispersion of gaps between electrodes where light-emitting elements are disposed.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, a display device may include a first electrode disposed on a substrate; a second electrode disposed on the substrate and spaced apart from the first electrode; at least one light-emitting element extending in a direction, disposed between the first electrode and the second electrode, and electrically connected to the first electrode and the second electrode; and an insulating pattern layer disposed on the first electrode and the second electrode the insulating pattern layer including a fixer disposed on at least part of the at least one light-emitting element; and a barrier surrounding the at least one light-emitting element.

In an embodiment, the insulating pattern layer may include an inorganic insulating material.

In an embodiment, the fixer and the barrier may be integral with each other, and the fixer extends across the barrier.

In an embodiment, the insulating pattern layer may include holes which are surrounded by the fixer and the barrier, and the holes may include a first hole exposing a first end of the at least one light-emitting element, and a second hole spaced apart from the first hole and exposing a second end of the at least one light-emitting element.

In an embodiment, the display device may include a first contact electrode disposed on the insulating pattern layer, being in electrical contact with the first electrode and the first end of the at least one light-emitting element, and electrically connecting the first electrode and the at least one light-emitting element, and a second contact electrode disposed on the insulating pattern layer, being in electrical contact with the second electrode and the second end of the at least one light-emitting element, and electrically connecting the second electrode and the at least one light-emitting element.

In an embodiment, the first contact electrode may be in electrical contact with the first end of the at least one light-emitting element exposed by the first hole, and the second contact electrode is in electrical contact with the second end of the at least one light-emitting element exposed by the second hole.

In an embodiment, a thickness of the barrier may be greater than a diameter of the at least one light-emitting element.

In an embodiment, the thickness of the barrier may be about 7500 Å to about 8500 Å.

In an embodiment, a thickness of the fixer may be equal to the thickness of the barrier.

In an embodiment, an internal diameter of the barrier may be greater than a length of the at least one light-emitting element in the direction.

In an embodiment, a width of the fixer in the direction may be smaller than the length of the at least one light-emitting element in the one direction.

In an embodiment, the at least one light-emitting element and side surfaces of the barrier facing the at least one light-emitting element may be spaced apart from each other.

In an embodiment, side surfaces of the barrier may be inclined with respect to a bottom surface of the barrier.

In an embodiment, the side surfaces of the barrier may be inclined at an angle of about 75° to about 85° with respect to the bottom surface of the barrier.

In an embodiment, the display device may further include a reflective layer disposed on the barrier.

In an embodiment, the reflective layer may be disposed on the side surfaces of the barrier.

In an embodiment, the first electrode may include a first electrode stem extending in a first direction, and a plurality of first electrode branches extending from the first electrode stem in a second direction intersecting the first direction, the second electrode includes a second electrode stem spaced apart from the first electrode stem in the second direction and extending in the first direction, and a plurality of second electrode branches extending from the second electrode stem in the second direction. The plurality of first electrode branches and the plurality of second electrode branches may be alternately arranged in the first direction.

In an embodiment, the at least one light-emitting element may be disposed between at least one of the plurality of first electrode branches and at least one of the plurality of second electrode branches, and the insulating pattern layer is disposed on the at least one of plurality of first electrode branches and the at least one of plurality of second electrode branches.

In an embodiment, the direction, which is an extension direction of the light-emitting element, may be substantially perpendicular to the second direction.

In an embodiment, the at least one light-emitting element may include a first semiconductor layer, a second semiconductor layer, and an active layer which is disposed between the first and second semiconductor layers, and the first semiconductor layer, the active layer, and the second semiconductor layer are sequentially arranged in the direction in which the at least one light-emitting element extends.

According to the aforementioned and other embodiments of the disclosure, a plurality of electrodes each having a stem and branches may be provided, and a plurality of light-emitting elements may be disposed between the branches. The light-emitting elements can be placed at desired locations by controlling the distance between the branches, and the alignment of the light-emitting elements can be improved.

An electrode layer may formed ahead of barriers that may change the traveling direction of light emitted from the light-emitting elements, and the electrodes can be formed directly on a circuit element layer with no height difference. As a result, the amount of exposure light during the formation of the electrodes can be easily adjusted, and the distribution of the electrodes can be easily managed by preventing any short circuits that may be caused by residual films.

Other features and embodiments may be apparent to those skilled in the art from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

The invention will now be described more fully hereinafter with reference to the accompanying drawings, in which preferred embodiments of the invention are shown. This invention may, however, be embodied in different forms and should not be construed as being limited to the embodiments set forth herein. Rather, these embodiments are provided so that this disclosure will be thorough and complete, and will convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," or the like may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Embodiments of the disclosure will hereinafter be described with reference to the accompanying drawings.

Figure 1:
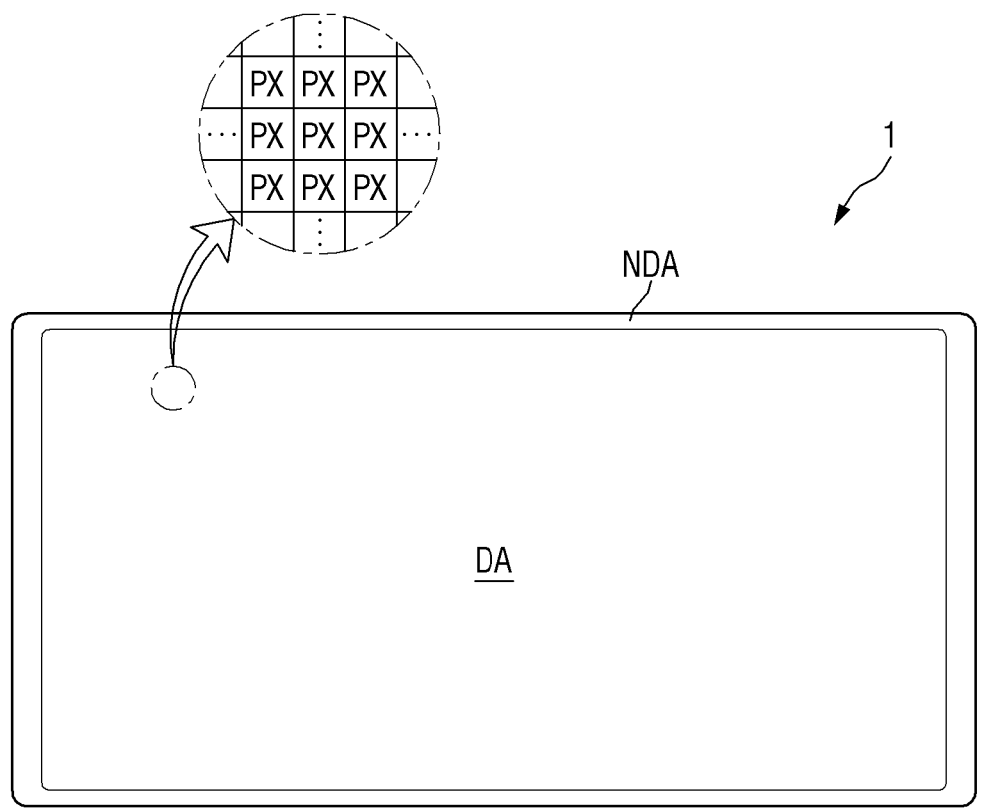
FIG. 1 is a schematic plan view of a display device according to one embodiment of the disclosure.
Figure 1:
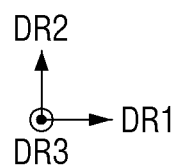

FIG. 1 is a schematic plan view of a display device according to an embodiment of the disclosure.

Referring to FIG. 1, a display device 1 displays a moving or still image. The display device 1 may refer to nearly all types of electronic devices that provide a display screen.

Examples of the display device 1 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 1 may include a display panel that provides a display screen. Examples of the display panel include an inorganic light-emitting diode (ILED) display panel, an organic LED (OLED) display panel, a quantum-dot light-emitting diode (QLED) display panel, a plasma display panel (PDP), and a field emission display (FED) panel. The display panel of the display device 1 will hereinafter be described as being an ILED display panel, but the disclosure is not limited thereto.

First, second, and third directions DR1, DR2, and DR3 are defined as illustrated in the accompanying drawings. Specifically, the first and second directions DR1 and DR2 may be directions that are perpendicular to each other within the same plane. The third direction DR3 may be a direction that is perpendicular to the plane that includes the first and second directions DR1 and DR2. The third direction DR3 may be perpendicular to each of the first and second directions DR1 and DR2. The third direction DR3 refers to the thickness direction of the display device 1.

Unless specified otherwise, the terms "above" and "top," as used herein, refer to the third direction DR3 (or the display direction of the display device 1), and the term "top surface," as used herein, refers to a surface that is directed to the third direction DR3. Also, unless specified otherwise, the terms "below" and "bottom," as used herein, refer to the opposite direction of the third direction DR3 (or the opposite direction of the display direction of the display device 1), and the term "bottom surface," as used herein, refers to a surface that is directed to the opposite direction of the third direction DR3. Also, unless specified otherwise, the terms "left," "right," "upper," and "lower," as used herein, refer to their respective directions in a plan view. For example, the term "left" refers to the opposite direction of the first direction DR1, the term "right" refers to the first direction DR1, the term "upper" refers to the second direction DR2, and the term "lower" refers to the opposite direction of the second direction DR2.

The display device 1 may have a rectangular shape that is longer in the first direction DR1 than in the second direction DR2 in a plan view. The corners at which the long sides and the short sides of the display device 1 meet may be right-angled, but the disclosure is not limited thereto. As another example, the corners at which the long sides and the short sides of the display device 1 meet may be rounded. However, the planar shape of the display device 1 is not particularly limited and may vary. The display device 1 may have various shapes other than a rectangular shape, such as a square shape, a rectangular shape with rounded corners, a polygonal shape, or a circular shape.

The display device 1 may include a display area DA and a non-display area NDA. The display area DA is an area in which a screen is displayed, and the non-display area NDA is an area in which a screen is not displayed. The display area DA may also be referred to as an active area, and the non-display area NDA may also be referred to as an inactive area.

The shape of the display area DA may conform to the shape of the display device 1. For example, the display area DA may have a similar shape to the display device 1, i.e., a rectangular shape, in a plan view, but the disclosure is not limited thereto. As another example, the display area DA may have a different shape from the display device 1. The display area DA may generally account for the middle part of the display device 1.

The display area DA may include pixels PX. The pixels PX may be arranged in row and column directions. The pixels PX may have a rectangular or square shape in a plan view, but the disclosure is not limited thereto. As another example, the pixels PX may have a rhombus shape that is inclined with respect to the first or second direction. The pixels PX may be alternately arranged in a stripe fashion or a PenTile® fashion.

The non-display area NDA may be disposed on the periphery of the display area DA. The non-display area NDA may surround the entire display area DA or part of the display area DA. The display area DA may have a rectangular shape, and the non-display area NDA may be disposed adjacent to four sides of the display area DA. The non-display area NDA may form the bezel of the display device 10. Wires or circuit drivers included in the display device 1 may be disposed in the non-display area NDA, or external devices may be mounted in the non-display area NDA.

Figure 2:
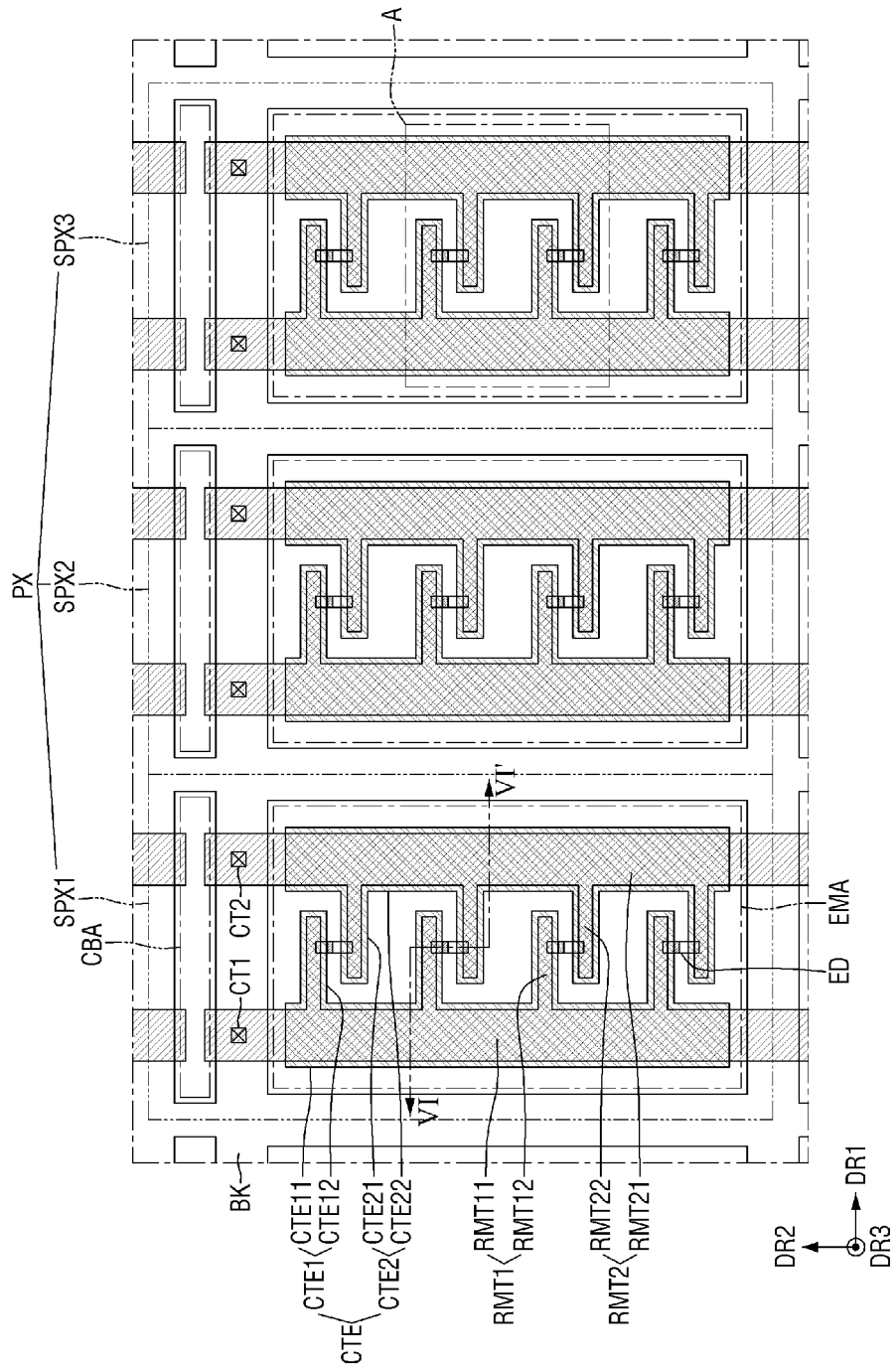
FIG. 2 is a schematic layout view of a pixel of the display device of FIG. 1.
Figure 3:
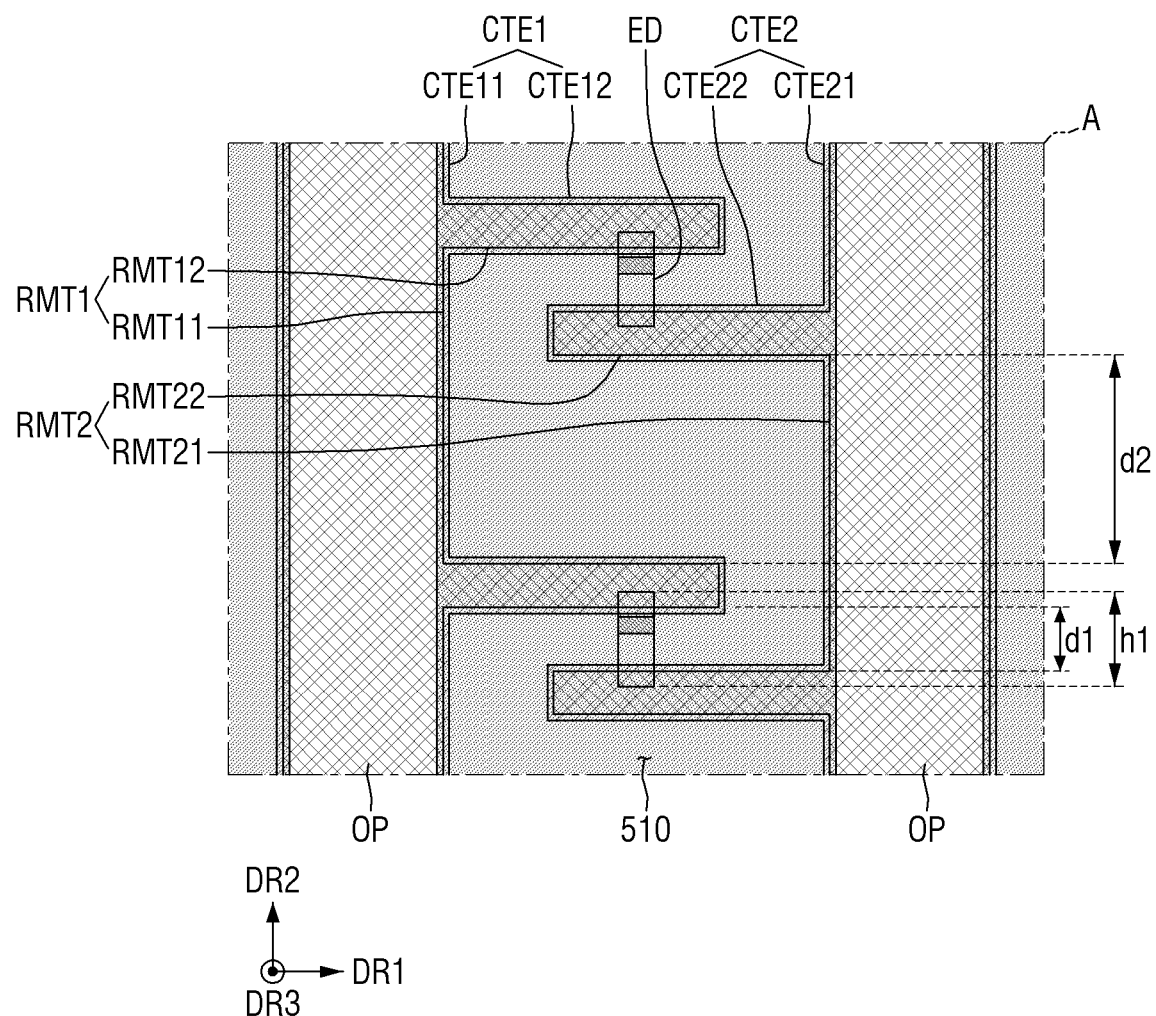
FIG. 3 is a schematic enlarged layout view of an area A of FIG. 2 and illustrates the relative arrangement of first and second electrodes, first and second contact electrodes, light-emitting elements, and a first insulating layer.
Figure 4:
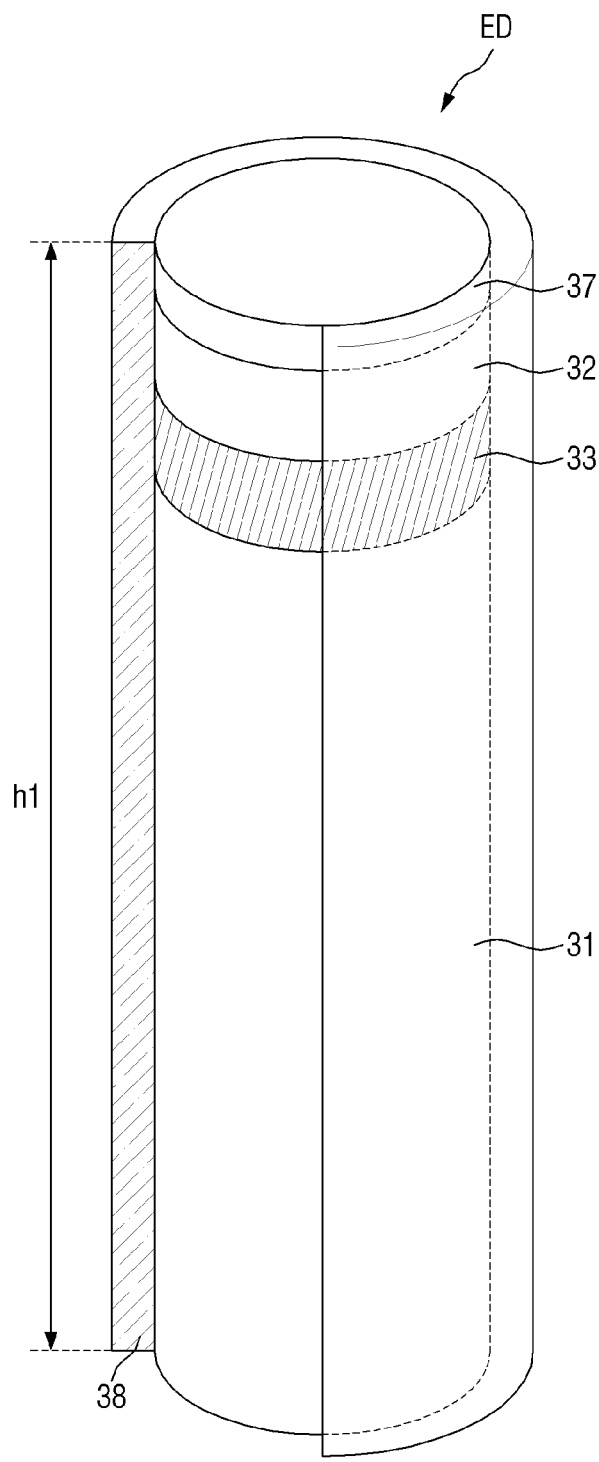
FIG. 4 is a schematic perspective view of a light-emitting element according to an embodiment of the disclosure.
Figure 5:
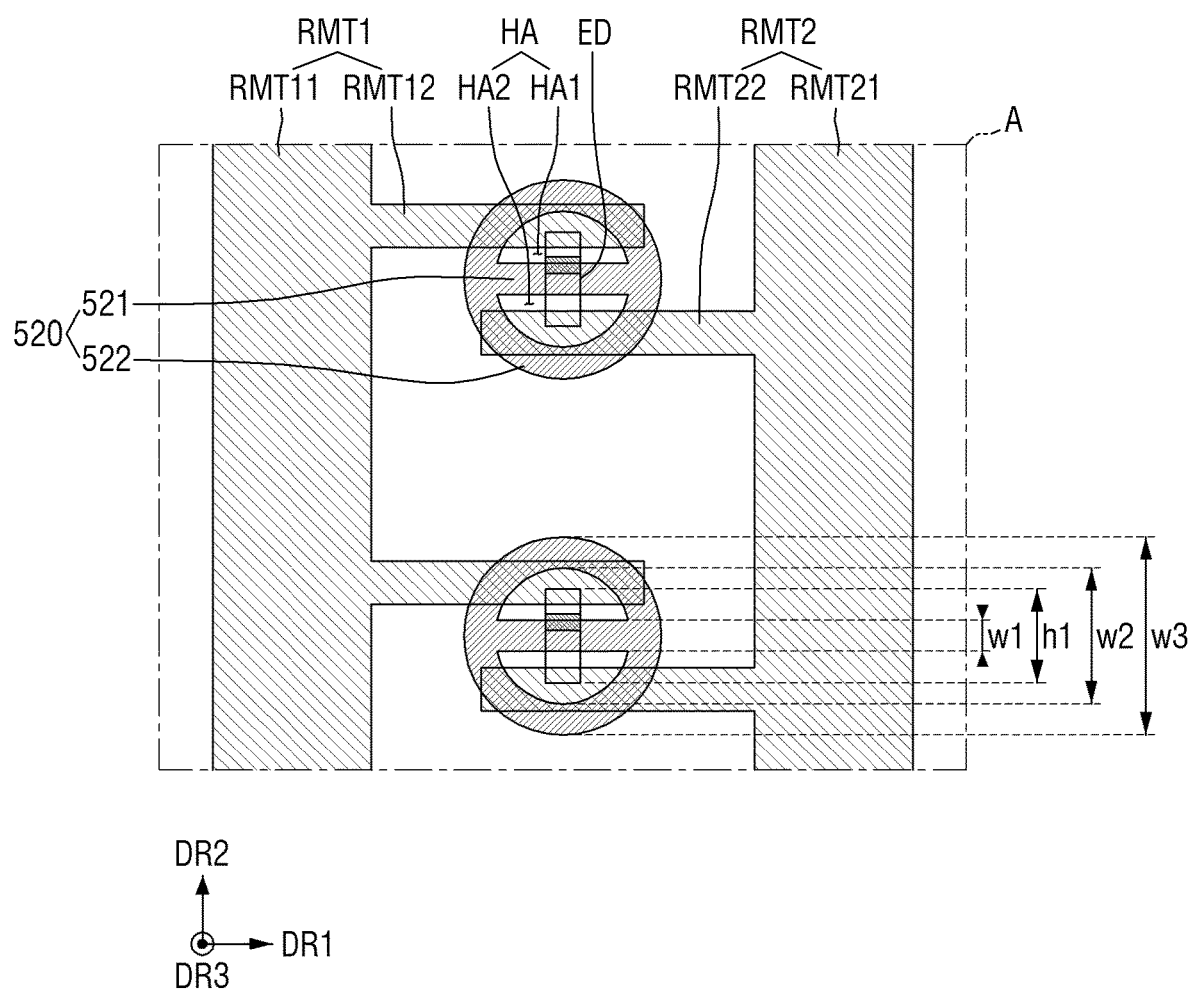
FIG. 5 is a schematic enlarged layout view of the area A of FIG. 2 and illustrates another relative arrangement of the first and second electrodes, the first and second contact electrodes, the light-emitting elements, and the first insulating layer.
Figure 6:
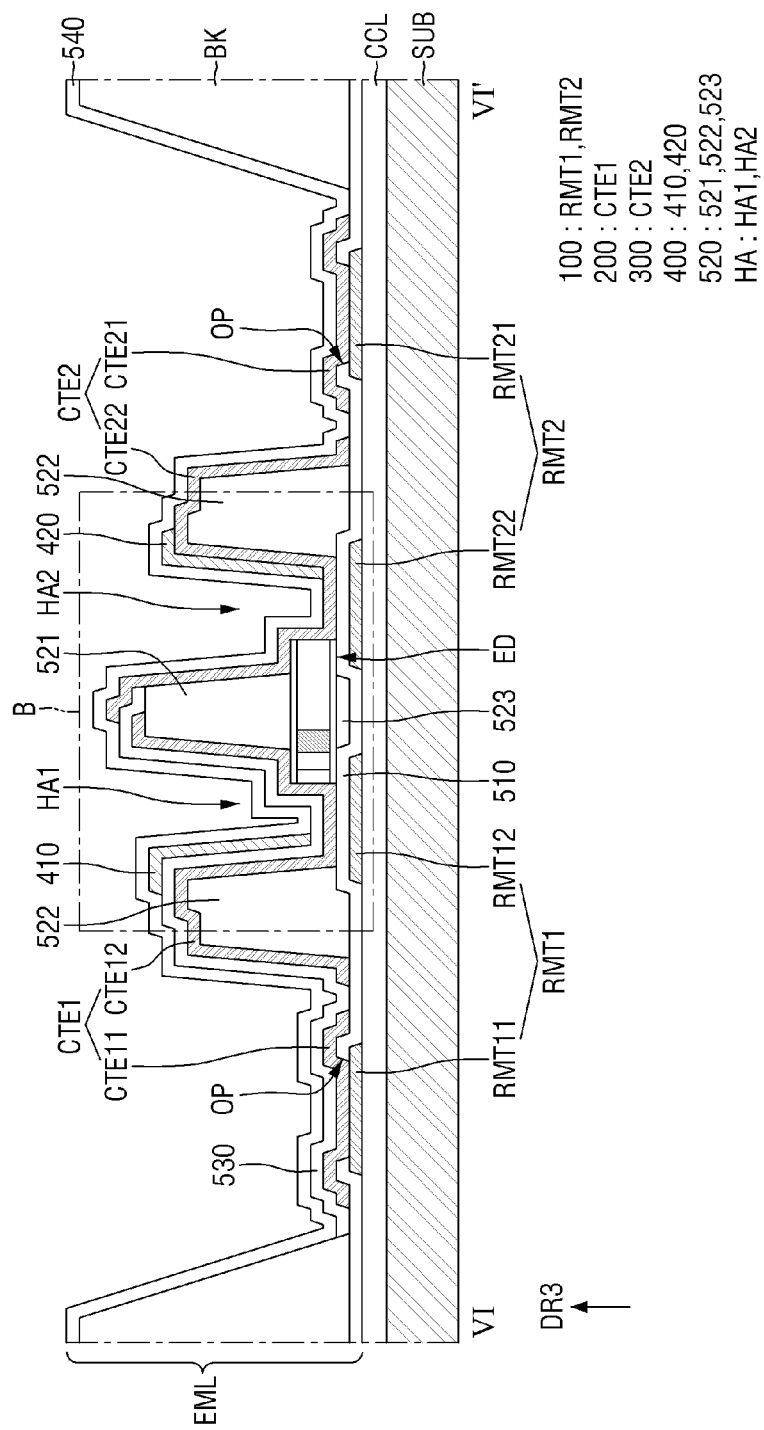
FIG. 6 is a schematic cross-sectional view, taken along line VI-VI' of FIG. 2, of the display device of FIG. 1.

FIG. 2 is a schematic layout view of a pixel of the display device of FIG. 1. FIG. 3 is a schematic enlarged layout view of an area A of FIG. 2 and illustrates the relative arrangement of first and second electrodes, first and second contact electrodes, light-emitting elements, and a first insulating layer. FIG. 4 is a schematic perspective view of a light-emitting element according to an embodiment of the disclosure. FIG. 5 is a schematic enlarged layout view of the area A of FIG. 2 and illustrates another relative arrangement of the first and second electrodes, the first and second contact electrodes, the light-emitting elements, and the first insulating layer. FIG. 6 is a schematic cross-sectional view, taken along line VI-VI' of FIG. 2, of the display device of FIG. 1.

Referring to FIGS. 2 through 6, the display device 1 may include the substrate SUB, a circuit element layer CCL, which is disposed on the substrate SUB, and a light-emitting element layer EML, which is disposed on the circuit element layer CCL. The light-emitting element layer EML may include first electrodes RMT1, second electrodes RMT2, contact electrodes CTE, a reflective layer 400, light-emitting elements ED, and insulating layers. The insulating layers may include a first insulating layer 510, an insulating pattern layer, a second insulating layer 530, and a third insulating layer 540.

The layout of layers included in the light-emitting element layer EML in each of the pixels PX of the display device 1 will hereinafter be described with reference to FIG. 2.

Referring to FIG. 2, a pixel PX may include subpixels SPXn (where n is an integer of 1 to 3). For example, the pixel PX may include first, second, and third subpixels SPX1, SPX2, and SPX3. The first subpixel SPX1 may emit light of a first color, the second subpixel SPX2 may emit light of a second color, and the third subpixel SPX3 may emit light of a third color. The first, second, and third colors may be blue, green, and red, respectively. However, the disclosure is not limited to this. As another example, the subpixels SPXn may emit light of the same color. FIG. 2 illustrates that the pixel PX includes three subpixels SPXn, but the disclosure is not limited thereto. As another example, the pixel PX may include more than three subpixels SPXn.

Each of the subpixels SPXn may include first and second electrodes RMT1 and RMT2, contact electrodes CTE, and light-emitting elements ED. The display device 1 may further include a bank BK, which is disposed between the subpixels SPXn.

Each of the subpixels SPXn may include an emission area EMA and a non-emission area. The emission area EMA may be an area that emits light, and the non-emission area may be an area that does not emit light. The emission area EMA may be an area that outputs light emitted by the light-emitting elements ED, and the non-emission area may be an area that the light emitted by the light-emitting elements ED does not arrive at, and as a result, no light is emitted from.

The emission area EMA may include a region where the light-emitting elements ED are disposed and a region around the region where the light-emitting elements ED are disposed. The emission area EMA may further include a region where the light emitted by the light-emitting elements ED is reflected or refracted by other elements and is thus emitted.

Each of the subpixels SPXn may further include a cut area CBA, which is disposed in the non-emission area. The cut area CBA may be disposed on a first side in the second direction DR2, of the emission area EMA. The cut area CBA may be disposed between emission areas EMA of each pair of adjacent subpixels SPXn in the second direction DR2.

Emission areas EMA of the subpixels SPXn of the pixel PX may be arranged to be spaced apart from one another in the first direction DR1. Similarly, cut areas CBA of the subpixels SPXn of the pixel PX may be arranged to be spaced apart from one another in the first direction DR1. Emission areas EMA may be arranged to be spaced apart from one another in the first direction DR1, cut areas CBA may be arranged to be spaced apart from one another in the first direction DR1, and the emission areas EMA and the cut areas CBA may be alternately arranged in the second direction DR2.

The cut area CBA may be a region where the first electrode RMT1 are separated into parts in the second direction DR2, and the second electrode RMT2 is separated into parts in the second direction DR2. The light-emitting elements ED may not be disposed in the cut area CBA. Parts of the first and second electrodes RMT1 and RMT2 may be disposed in the cut area CBA. The first electrode RMT1 may be separated into parts in the cut area CBA, and the second electrodes RMT2 may be separated into parts in the cut area CBA.

The first and second electrodes RMT1 and RMT2 may be electrically connected to the light-emitting elements ED and may apply electrical signals to the light-emitting elements ED so that the light-emitting elements ED can emit light. For example, the first and second electrodes RMT1 and RMT2 may be electrically connected to the light-emitting elements ED via the first and second contact electrodes CTE1 and CTE2. Electrical signals applied from the circuit element layer CCL to the first and second electrodes RMT1 and RMT2 may be transmitted to the light-emitting elements via contact electrodes CTE.

The bank BK may include parts that extend in the first direction DR1 and parts that extend in the second direction DR2, in a plan view, and may be disposed on the entire surface of the display area DA in a lattice pattern. The bank BK may be disposed along the boundaries between the subpixels SPXn to separate the subpixels SPXn.

The bank BK may be disposed to surround the emission areas EMA and the cut areas CBA of the subpixels SPXn to separate the emission areas EMA and the cut areas CBA of the subpixels SPXn. The width, in the first direction DR1, of the bank BK between the emission areas EMA of the subpixels SPXn, which are adjacent to one another in the first direction DR1, may be greater than the width, in the first direction DR1, of the bank BK between the cut areas CBA of the subpixels SPXn, which are adjacent to one another in the first direction DR1. Accordingly, the distance, in the first direction DR1, between the cut areas CBA of the subpixels SPXn may be smaller than the distance, in the first direction DR1, between the emission areas EMA of the subpixels SPXn.

In case that an inkjet printing process for arranging the light-emitting elements ED is performed during the fabrication of the display device 1, the bank BK may prevent ink including the light-emitting elements ED from spilling over from one subpixel SPXn to another subpixel SPXn.

As already mentioned above, the first and second electrodes RMT1 and RMT2 may be electrically connected to the light-emitting elements ED and may thus transmit electrical signals to the light-emitting elements ED so that the light-emitting elements ED may emit light of a particular wavelength range. For example, the first and second electrodes RMT1 and RMT2 may receive a predetermined voltage. At least parts of the first and second electrodes RMT1 and RMT2 may form an electrical field in the subpixel SPXn to align the light-emitting elements ED in the emission area EMA.

The first electrode RMT1 may include a first electrode stem RMT11 and first electrode branches RMT12, which branch off of the first electrode stem RMT11.

The first electrode stem RMT11 may be disposed on the left side (or a second side, in the first direction DR1) of the subpixel SPXn in a plan view. The first electrode stem RMT11 may extend in the second direction DR2. The first electrode stem RMT11 may extend in the second direction DR2 in the subpixel SPXn, and both ends of the first electrode stem RMT11 may be terminated in the cut area CBA to be spaced apart from first electrode stems RMT11 of neighboring subpixels SPXn in the second direction DR2. First electrode stems RMT11 of subpixels SPXn arranged in the same column (i.e., an array of subpixels SPXn arranged in the second direction DR2) may substantially be on the same straight line.

The first electrode branches RMT12 may branch off of the first electrode stem RMT11. The first electrode branches RMT12 may branch off of the first electrode stem RMT11 to extend in the first direction DR1. The first electrode branches RMT12 may be arranged side-by-side in the first direction DR1.

The second electrode RMT2 may include a second electrode stem RMT21 and second electrode branches RMT22, which branch off of the second electrode stem RMT21. The second electrode RMT2 may be disposed to be spaced apart from the first electrode RMT1.

The second electrode stem RMT21 may be disposed on the right side (or a first side in the first direction DR1) of the subpixel SPXn in a plan view. The second electrode stem RMT21 may be disposed to be spaced apart from the first electrode stem RMT11 in the first direction DR1. The second electrode stem RMT21 may extend in the second direction DR2. The second electrode stem RMT21 may extend in the second direction DR2 in the subpixel SPXn, and both ends of the second electrode stem RMT21 may be terminated in the cut area CBA to be spaced apart from second electrode stems RMT21 of the neighboring subpixels SPXn in the second direction DR2. Second electrode stems RMT21 of subpixels SPXn arranged in the same column (i.e., second electrode stems RMT21 of an array of subpixels SPXn arranged in the second direction DR2) may substantially be on the same straight line.

The second electrode branches RMT22 may branch off of the second electrode stem RMT21. The second electrode branches RMT22 may branch off of the second electrode stem RMT21 to extend in the opposite direction of the first direction DR1 and may be terminated to be spaced apart from the first electrode stem part RMT11. The ends of the second electrode branches RMT22 may be disposed to be spaced apart from the first electrode stem RMT11. The second electrode branches RMT22 may be arranged side-by-side in the first direction DR1.

The first electrode branches RMT12 and the second electrode branches RMT22 may be disposed in the emission area EMA. The first electrode branches RMT12 and the second electrode branches RMT22 may be alternately arranged in the second direction DR2 in the emission area EMA. The first electrode branches RMT12 and the second electrode branches RMT22 may be alternately arranged in the order of a second electrode branch RMT22, a first electrode branch RMT12, a second electrode branch RMT22, and a first electrode branch RMT12 in the second direction DR2 (i.e., in a direction from the lower side to the upper side of the emission area EMA in a plan view) from the lower side of the emission area EMA, but the disclosure is not limited thereto. As another example, the first electrode branches RMT12 and the second electrode branches RMT22 may be alternately arranged in the order of a first electrode branch RMT12, a second electrode branch RMT22, a first electrode branch RMT12, and a second electrode branch RMT22 in the second direction DR2 (i.e., in the direction from the lower side to the upper side of the emission area EMA in a plan view) from the lower side of the emission area EMA, but the disclosure is not limited thereto.

The first electrode branches RMT12 and the second electrode branches RMT22 may be disposed to be spaced apart from each other in the second direction DR2.

As already mentioned above, the first and second electrode stems RMT11 and RMT21 may extend in the second direction DR2. The first and second electrode stems RMT11 and RMT21 may be disposed in the subpixel SPXn to extend across part of the bank BK that extends in the first direction DR1 to separate the emission area EMA and the cut area CBA. The first and second electrode stems RMT11 and RMT21 may overlap part of the bank BK between the cut area CBA and the emission are EMA, and the contact holes (CT1 and CT2) may be formed in the overlapping areas of the bank BK and the first and second electrode stems RMT11 and RMT21. The first and second electrodes RMT1 and RMT2 may be electrically connected to the circuit element layer CCL via the contact holes (CT1 and CT2) to receive electrical signals from the circuit element layer CCL.

Each of the first and second electrodes RMT1 and RMT2 is illustrated as including one electrode stem, i.e., the first or second electrode stem RMT11 and RMT21, and four electrode branches branching off of the first or second electrode stem RMT11 and RMT21, i.e., the first or second electrode branches RMT12 and RMT22, but the disclosure is not limited thereto. As another example, each of the first and second electrodes RMT1 and RMT2 may include more than four electrode branches RMT12 or RMT22.

The light-emitting elements ED may be disposed between the first and second electrodes RMT1 and RMT2. For example, the light-emitting elements ED may be disposed between the first electrode branches RMT12 and the second electrode branches RMT22, between the first and second electrode stems RMT11 and RMT21. The light-emitting elements ED may be disposed on the first and second electrode branches RMT12 and RMT22 to have their both ends overlap the first and second electrode stems RMT12 and RMT22 of the first and second electrodes RMT1 and RMT2.

First ends of the light-emitting elements ED may be electrically connected to the first electrode RMT1, and second ends of the light-emitting elements ED may be electrically connected to the second electrode RMT2. The light-emitting elements ED may be electrically connected to the first and second electrodes RMT1 and RMT2 via the contact electrodes CTE.

The contact electrodes CTE may be disposed in the emission area EMA. The contact electrodes CTE may include the first and second contact electrodes CTE1 and CTE2. The first and second contact electrodes CTE1 and CTE2 may be in electrical contact with the first and second electrodes RMT1 and RMT2, respectively, and with the light-emitting elements ED, in the emission area EMA. The first and second contact electrodes CTE1 and CTE2 may electrically connect the first and second electrodes RMT1 and RMT2 and the light-emitting elements ED.

The first contact electrode CTE1 may be disposed on the first electrode RMT1. The first contact electrode CTE1 may be disposed to overlap the first electrode RMT1 in the third direction DR3, in the emission area EMA.

The first contact electrode CTE1 may conform to the shape of the first electrode RMT1. The first contact electrode CTE1 may have a similar shape to the first electrode RMT1 in a plan view. The first contact electrode CTE1 may be disposed to completely cover the first electrode RMT1 in the third direction DR3, but the disclosure is not limited thereto. The first contact electrode CTE1 may have a similar shape to, but a larger size than, the first electrode RMT1 to completely cover the first electrode RMT1 in the third direction DR3 in a plan view.

The first contact electrode CTE1 may include a first contact electrode stem CTE11 and first contact electrode branches CTE12, which branch off of the first contact electrode stem CTE11.

The first contact electrode stem CTE11 may extend in the second direction DR2. The first contact electrode stem CTE11 may extend in the second direction DR2 and may be terminated in both the upper and lower parts of the emission area EMA so that both ends of the first contact electrode stem CTE11 may be within the emission area EMA.

The first contact electrode stem CTE11 may be disposed on the first electrode stem RMT11, in the emission area EMA. The first contact electrode stem CTE11 may overlap the first electrode stem RMT11 in the third direction DR3. The first contact electrode stem CTE11 may be disposed to completely cover the first electrode stem RMT11 in the third direction DR3.

The first contact electrode branches CTE12 may branch off of the first contact electrode stem CTE11. The first contact electrode branches CTE12 may branch off of the first contact stem CTE11 to extend in the first direction DR1. The first contact electrode branches CTE12 may be arranged side-by-side in the first direction DR1.

The first contact electrode branches CTE12 may be disposed on the first electrode branches RMT12, in the emission area EMA. The first contact electrode branches CTE12 may overlap the first electrode branches RMT12 in the third direction DR3. The first contact electrode branches CTE12 may be disposed to completely cover the first electrode branches RMT12 in the third direction DR3.

The second contact electrode CTE2 may be disposed to be spaced apart from the first contact electrode CTE1. The second contact electrode CTE2 may be disposed on the second electrode RMT2. The second contact electrode CTE2 may be disposed to overlap the second electrode RMT2 in the third direction DR3, in the emission area EMA.

The second contact electrode CTE2 may conform to the shape of the second electrode RMT2. The second contact electrode CTE2 may have a similar shape to the second electrode RMT2 in a plan view. The second contact electrode CTE2 may be disposed to completely cover the second electrode RMT2 in the third direction DR3, but the disclosure is not limited thereto. The second contact electrode CTE2 may have a similar shape to, but a larger size than, the second electrode RMT2 to completely cover the second electrode RMT2 in the third direction DR3 in a plan view.

The second contact electrode CTE2 may include a second contact electrode stem CTE21 and second contact electrode branches CTE22, which branch off of the second contact electrode stem CTE21.

The second contact electrode stem CTE21 may extend in the second direction DR2. The second contact electrode stem CTE21 may extend in the second direction DR2 and may be terminated in both the upper and lower parts of the emission area EMA so that both ends of the second contact electrode stem CTE21 may be within the emission area EMA.

The second contact electrode stem CTE21 may be disposed on the second electrode stem RMT21, in the emission area EMA. The second contact electrode stem CTE21 may overlap the second electrode stem RMT21 in the third direction DR3. The second contact electrode stem CTE21 may be disposed to completely cover the second electrode stem RMT21 in the third direction DR3.

The second contact electrode branches CTE22 may branch off of the second contact electrode stem CTE21. The second contact electrode branches CTE22 may branch off of the second contact stem CTE21 to extend in the opposite direction of the first direction DR1. The second contact electrode branches CTE22 may be arranged side-by-side in the first direction DR1.

The second contact electrode branches CTE22 may be disposed on the second contact electrode branches RMT22, in the emission area EMA. The second contact electrode branches CTE22 may overlap the second contact electrode branches RMT22 in the third direction DR3. The second contact electrode branches CTE22 may be disposed to completely cover the second electrode branches RMT22 in the third direction DR3.

The first and second contact electrodes CTE1 and CTE2 may be disposed to be spaced apart from each other. The first and second contact electrodes CTE1 and CTE2 may be insulated from each other.

The shape of light-emitting elements ED and the relative arrangement of first and second electrodes RMT1 and RMT2, first and second contact electrodes CTE1 and CTE2, and a first insulating layer 510 in a plan view will hereinafter be described with reference to FIGS. 3 and 4.

As already mentioned above, light-emitting elements ED may be disposed in a region where first electrode branches RMT12 and second electrode branches RMT22 are spaced apart from, and face, each other between first and second electrode stems RMT11 and RMT21.

In one embodiment, the light-emitting elements ED may be light-emitting diodes (LEDs). For example, the light-emitting elements ED may be inorganic LEDs (ILEDs) having a size of several micrometers or nanometers and including an inorganic material. An ILED may be aligned by forming an electric field between two electrodes. For example, an ILED may form an electric field in a particular direction between two opposing electrodes and may thus be aligned and disposed between the two electrodes.

Referring to FIG. 4, a light-emitting element ED may have a shape that extends in one direction. The light-emitting element ED may have a rod, wire, or tube shape. For example, the light-emitting element ED may have a cylindrical or rod shape, but the disclosure is not limited thereto. In another example, the light-emitting element ED may have a polygonal column shape such as the shape of a regular cube, a rectangular parallelepiped, or a hexagonal column or may have a shape that extends in one direction but with a partially inclined outer surface. Semiconductors included in the light-emitting element ED may be sequentially disposed or stacked in the direction in which the light-emitting element ED extends.

The light-emitting element ED may include semiconductor layers doped with impurities of an arbitrary conductivity type (e.g., a p-type or an n-type). The semiconductor layers may receive electrical signals from an external power source to emit light of a particular wavelength range.

The light-emitting element ED may include a first semiconductor layer 31, a second semiconductor layer 32, an active layer 33, an electrode layer 37, and an insulating film 38.

The first semiconductor layer 31 may include an n-type semiconductor. For example, in a case where the light-emitting element ED emits light of a blue wavelength range, the first semiconductor layer 31 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be at least one of AlGaInN, GaN, AlGaN, InGaN, AlN, and InN that are doped with an n-type dopant. The first semiconductor layer 31 may be doped with an n-type dopant, and the n-type dopant may be, for example, Si, Ge, or Sn. For example, the first semiconductor layer 31 may be n-GaN doped with n-type Si. The first semiconductor layer 31 may have a thickness of about 1.5 μm to about 5 μm in the direction in which the light-emitting element ED extends, but the disclosure is not limited thereto.

The second semiconductor layer 32 may be disposed to be spaced apart from the first semiconductor layer 31 in the direction in which the light-emitting element ED extends. The second semiconductor layer 32 may include a p-type semiconductor. For example, in a case where the light-emitting element ED emits light of a blue or green wavelength range, the second semiconductor layer 32 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be at least one of AlGaInN, GaN, AlGaN, InGaN, AlN, and InN that are doped with a p-type dopant. The second semiconductor layer 32 may be doped with a p-type dopant, and the p-type dopant may be, for example, Mg, Zn, Ca, Se, or Ba. For example, the second semiconductor layer 32 may be p-GaN doped with p-type Mg. The second semiconductor layer 32 may have a thickness of about 0.05 μm to about 0.10 μm in the direction in which the light-emitting element ED extends, but the disclosure is not limited thereto.

The first and second semiconductor layers 31 and 32 are illustrated as being formed as single-layer films. As another example, each of the first and second semiconductor layers 31 and 32 may include more than one layer such as, for example, a clad layer or a tensile strain barrier reducing (TSBR) layer, depending on the material of the active layer 33.

The active layer 33 is disposed between the first and second semiconductor layers 31 and 32. The active layer 33 may include a single- or multi-quantum well structure material. In a case where the active layer 33 includes a material having a multi-quantum well structure, the active layer 33 may have a structure in which multiple quantum layers and multiple well layers are alternately stacked. The active layer 33 may emit light by combining electron-hole pairs in accordance with electrical signals applied thereto via the first and second semiconductor layers 31 and 32. For example, in a case where the active layer 33 emits light of a blue wavelength range, the active layer 33 may include a material such as AlGaN or AlGaInN. In one embodiment, the active layer 33 may include AlGaInN as its quantum layer and AlInN as its well layer and may emit blue light having a central wavelength range of about 450 nm to about 495 nm.

However, the disclosure is not limited to this. As another example, the active layer 33 may have a structure in which a semiconductor material having a large band gap energy and a semiconductor material having a small band gap energy are alternately stacked. The type of light emitted by the active layer 33 is not limited to blue light. The active layer 33 may also emit light of a red or green wavelength range as necessary, instead of blue light. The active layer 33 may have a thickness of about 0.05 µm to about 0.10 µm in the direction in which the light-emitting element ED extends, but the disclosure is not limited thereto.

The electrode layer 37 may be disposed on the second semiconductor layer 32. The electrode layer 37 may be an ohmic contact electrode, but the disclosure is not limited thereto. As another example, the electrode layer 37 may be a Schottky contact electrode. The electrode layer 37 may include a conductive metal. For example, the electrode layer 37 may include at least one of Al, Ti, In, Au, Ag, ITO, IZO, and ITZO. Also, the electrode layer 37 may include a semiconductor material doped with an n- or p-type dopant. The electrode layer 37 may include the same material or different materials, but the disclosure is not limited thereto.

The insulating film 38 is disposed to surround the sides of the first and second semiconductor layers 31 and 32, the active layer 33, and the electrode layer 37. For example, the insulating film 38 may be disposed to surround at least the side of the active layer 33 and may extend in the direction in which the light-emitting element ED extends. The insulating film 38 may protect the first semiconductor layer 31, the second semiconductor layer 32, the active layer 33, and the electrode layer 37. For example, the insulating film 38 may be formed to surround the sides of the first semiconductor layer 31, the second semiconductor layer 32, the active layer 33, and the electrode layer 37, and to expose both ends, in the length direction, of the light-emitting element ED.

The insulating film 38 may have a thickness of about 10 nm to about 1.0 m, but the disclosure is not limited thereto. The insulating film 38 may have a thickness of about 40 nm.

The insulating film 38 may include a material with insulating properties such as, for example, silicon oxide ($SiO_x$), silicon nitride ($SiN_x$), silicon oxynitride ($SiO_xN_y$), aluminum nitride (AlN), or aluminum oxide ($Al_2O_3$). Accordingly, the insulating film 38 can prevent any short circuit that may occur in case that the active layer 33 is placed in direct contact with electrodes that transmit electrical signals directly to the light-emitting element ED. Since the insulating film 38 includes the active layer 33 to protect the outer surface of the light-emitting element ED, any degradation in the emission efficiency of the light-emitting element ED can be prevented.

A length h1 of the light-emitting element ED may be in the range of about 1 µm to about 10 µm, about 2 µm to about 6 µm, or about 3 µm to about 5 µm. The light-emitting element ED may have a diameter of about 30 nm to about 700 nm and may have an aspect ratio of about 1.2 to about 100. The light-emitting element ED may have a diameter of about 500 nm. However, the disclosure is not limited to this. Different light-emitting elements ED included in the display device 10 may have different diameters depending on the composition of their respective active layers 33.

Referring again to FIG. 3, in an emission area EMA, both ends of each light-emitting element ED, which extends in one direction, may be disposed on first and second electrode branches RMT12 and RMT22 of first and second electrodes RMT1 and RMT2, respectively. Light-emitting elements ED may be disposed to be spaced apart from each other and may be substantially aligned in the second direction DR2. For example, the light-emitting elements ED may have a shape that extends in one direction, and the direction in which the light-emitting elements ED extend may substantially form a right angle with the direction in which first electrode branches RMT12 and second electrode branches RMT22 extend. For example, the first electrode branches RMT12 and the second electrode branches RMT22 may extend along the first direction DR1, and the light-emitting elements ED may be aligned to extend in the second direction DR2 between the first electrode branches RMT12 and the second electrode branches RMT22. However, the disclosure is not limited to this example. The light-emitting elements ED may be arranged diagonally with respect to the direction in which the first electrode branches RMT12 and the second electrode branches RMT22 extend.

In one embodiment, the emission area EMA of the display device 1 may include unit branches. The unit branch may refer to a minimal unit comprising a first electrode branch RMT12 and a second electrode branch RMT22 between the first and second electrode stems RMT11 and RMT12 to cause the light-emitting elements ED to emit light. In order to be able to emit light, both ends of each light-emitting element ED may be electrically connected to the first electrode branches RMT12 and the second electrode branches RMT22, respectively.

The unit branches may be arranged repeatedly between the first and second electrode stems RMT11 and RMT12 in the second direction DR2. Each of the unit branches may include first and second electrode branches RMT12 and RMT22, which branch off of the first and second electrode stems RMT11 and RMT12, respectively. To be able to emit light, each light-emitting element ED may be disposed between the first and second electrode branches RMT12 and RMT22 of each of the unit branches.

As already mentioned above, the light-emitting elements ED may be aligned by applying electrical signals to the first and second electrodes RMT1 and RMT2. For example, during the fabrication of the display device 1, the light-emitting elements ED may be sprayed onto the first and second electrodes RMT1 and RMT2 and may then be aligned by applying electrical signals for aligning the light-emitting elements ED to the first and second electrodes RMT1 and RMT2. Once the electrical signals are applied, an electric field may be formed between the first and second electrodes RMT1 and RMT2, and the positions and the alignment directions of the light-emitting elements ED may be changed by an electric force from the electric field so that the light-emitting elements ED may be arranged between the first and second electrodes RMT1 and RMT2. The smaller the distance between the first and second electrodes RMT1 and RMT2 is, the stronger the electric force becomes. Thus, in order to properly align the light-emitting elements ED, a distance d1 between the first and second electrode branches RMT12 and RMT22 of each of the unit branches, the length h1 of the light-emitting elements ED, and a distance d2 between the first electrode branch RMT12 and the second electrode branch RMT22 included in the neighboring unit branches need to be set appropriately.

In each of the unit branches, the first and second electrode branches RMT12 and RMT22 may be arranged to be spaced apart from each other in the second direction DR2. In order for each light-emitting element ED to be arranged on the first and second electrode branches RMT12 and RMT22 of each of the unit branches, the distance d1 may be set to be smaller than the length h1. The distance d1 may be defined as the distance between the opposing sides of the first and second electrode branches RMT12 and RMT22 of each of the unit branches.

In order to arrange the light-emitting elements ED in the unit branches, particularly, between the first and second electrode branches RMT12 and RMT22 of each of the unit branches, but not between different unit branches, the distance d1 may be set to differ from the distance d2. For example, the distance d2 may be greater than the distance d1. Also, the distance d2 may be greater than the length h1.

For example, in a case where the length h1 is about 3 μm to about 5 μm, the distance d1 may be smaller than about 3 μm to about 5 μm. Also, in a case where the length h1 is about 3 μm to about 5 μm, the distance d2 may be about 10 μm to about 12 μm. If the distance d1 is set to be smaller than the distance d2, a stronger electric force can be applied between the first and second electrode branches RMT12 and RMT22 of each of the unit branches, and as a result, the alignment of the light-emitting elements ED can be improved. Also, if the distance d2 is set to be greater than the length h1, the light-emitting elements ED may not emit light, even if they are disposed between different unit branches, in case that they are not electrically connected between different unit branches.

Figure 7:
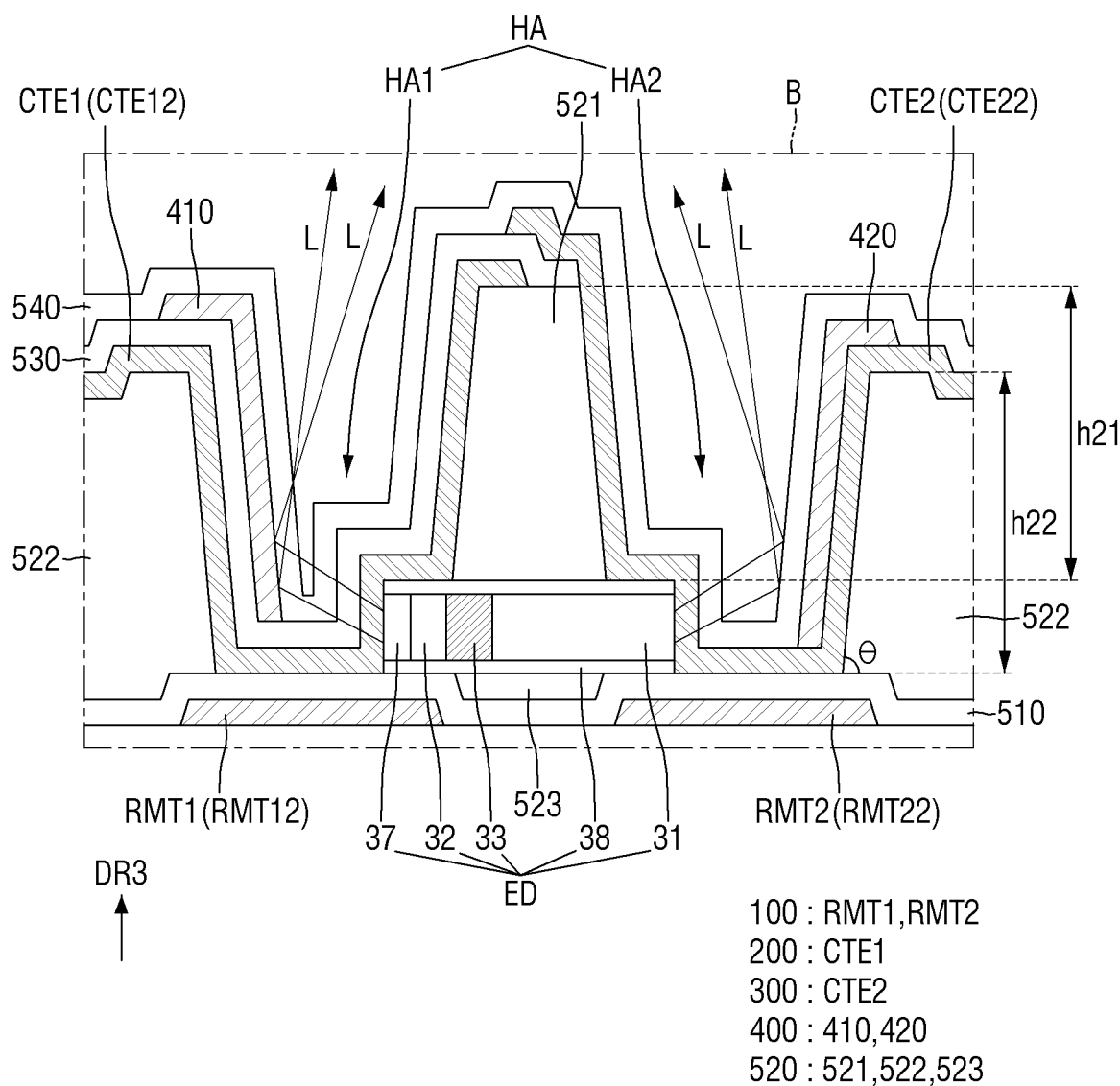
FIG. 7 is a schematic enlarged cross-sectional view of an area B of FIG. 6.

FIG. 7 is a schematic enlarged cross-sectional view of an area B of FIG. 6.

The relative arrangement of light-emitting elements ED, first and second electrodes RMT1 and RMT2, and the insulating pattern layer will hereinafter be described with reference to FIGS. 5 through 7.

In one embodiment, the display device 1 may include the insulating pattern layer, and the insulating pattern layer may include insulating patterns 520.

The insulating patterns 520 may be a predetermined distance apart from one another. The insulating patterns 520 may be disposed to be a predetermined distance apart from one another in the second direction DR2, in an emission area EMA of one subpixel SPXn. Each of the insulating patterns 520 may be disposed to overlap at least one light-emitting element ED in the third direction DR3. For example, each of the insulating patterns 520 may be disposed to correspond (e.g., one-to-one) to, and overlap, at least one light-emitting element ED on one unit branch, but the disclosure is not limited thereto. As another example, each of the insulating patterns 520 may be disposed to overlap all of light-emitting elements ED disposed on one unit branch.

The insulating patterns 520 may be disposed on first and second electrodes RMT1 and RMT2 in the emission area EMA. For example, the insulating patterns 520 may be disposed on first electrode branches RMT12 of the first electrode RMT1 and second electrode branches RMT22 of the second electrode RMT2.

The insulating patterns 520 may include fixers 521 and barriers 522.

The barriers 522 may be disposed to surround their respective light-emitting elements ED in a plan view. The barriers 522 may have a doughnut shape having an external diameter W3 and an internal diameter w2 in a plan view, but the disclosure is not limited thereto. The barriers 522 may have one or more of various other shapes, such as a square shape, an elliptical shape, or a rectangular shape, in a plan view.

The barriers 522 may not overlap the light-emitting elements ED in the third direction DR3. The internal diameter w2, which may be a minimum internal diameter, of the barriers 522 may be greater than the length h1 of the light-emitting elements h1. In this case, the barriers 522 may be disposed to surround the light-emitting elements ED and to completely expose the light-emitting elements ED in the third direction DR3.

The barriers 522 may not overlap the first electrode stem RMT11 of the first electrode RMT1 or the second electrode stem RMT21 of the second electrode RMT2 in the third direction DR3. The external diameter W3 of the barriers 522 may be smaller than the distance between the first and second electrode stems RMT11 and RMT21. The maximum external diameter of the barriers 522 may be formed to be smaller than the distance between the first and second electrode stems RMT11 and RMT21, and thus, the barriers 522 may be disposed in the gap between the first and second stems RMT11 and RMT21.

The barriers 522 may be disposed to surround the light-emitting elements ED and may change the traveling direction of light emitted from the light-emitting elements ED into an upward direction. This will be described below with reference to other drawings.

The fixers 521 may be formed to extend across the barriers 522. The fixers 521 may be integrally formed with the barriers 522. The fixers 521 may be disposed within the barriers 522, which are doughnut-shaped in a plan view, on the light-emitting elements ED, which are exposed by the barriers 522.

The direction in which the fixers 521 extend may be the same as the direction in which the first electrode branches RMT12 and the second electrode branches RMT22 extend. The fixers 521 may extend in the first direction DR1, within the spaces defined by the barriers 522. The direction in which the fixers 521 extend may be perpendicular to the direction in which the light-emitting elements ED extend between the first electrode branches RMT12 and the second electrode branches RMT22.

The fixers 521 may be disposed between the first electrode branches RMT12 and the second electrode branches RMT22. The fixers 521 may not overlap the first electrode branches RMT12 or the second electrode branches RMT22 in the third direction DR3. The fixers 521 may be disposed to expose at least parts of the light-emitting elements ED. The fixers 521 may be disposed on the light-emitting elements ED to expose both ends of each of the light-emitting elements ED. A width w1, in the second direction DR2, of the fixers 521 may be smaller than the length h1 of the light-emitting elements ED. In this case, both ends of each of the light-emitting elements ED may be exposed in the third direction DR3 by the fixers 521.

The fixers 521 may be disposed on at least parts of the light-emitting elements ED and may fix the light-emitting elements ED not to be lost during the fabrication of the display device 1.

The insulating patterns 520 may include holes HA, which are surrounded by the barriers 522 and the fixers 521. The holes HA may include first holes HA1 and second holes HA2. The first holes HA1 may be spaced apart from the second holes HA2. The first holes HA1 may expose first ends of the light-emitting elements ED disposed on the first electrode branches RMT12 in the third direction DR3, and the second holes HA2 may expose second ends of the light-emitting elements ED disposed on the second electrode branches RMT22 in the third direction DR3.

The cross-sectional structure, in each subpixel SPXn, of the display device 1 will hereinafter be described with reference to FIGS. 2 through 7.

As already mentioned above, the display device 1 may include the substrate SUB, the circuit element layer CCL, which is disposed on the substrate SUB, and the light-emitting element layer EML, which is disposed on the circuit element layer CCL.

The substrate SUB may be an insulating substrate. The substrate SUB may be formed of an insulating material such as glass, quartz, or a polymer resin. The substrate SUB may be a rigid substrate or a flexible substrate that is bendable, foldable, or rollable.

The circuit element layer CCL, which drives the pixels PX, may be disposed on the substrate SUB. The circuit element layer CCL may be disposed between the substrate SUB and the light-emitting element layer EML. The circuit element layer CCL may include pixel circuits such as switching elements driving the pixels PX.

The light-emitting element layer EML may include conductive layers (100, 200, and 300), which are disposed on the circuit element layer CCL, and insulating layers (510, 520, 530, and 540), which are also disposed on the circuit element layer CCL. In one embodiment, the conductive layers (100, 200, and 300) of the light-emitting element layer EML may include first, second, and third conductive layers 100, 200, and 300. The insulating layers (510, 520, 530, and 540) of the light-emitting element layer EML may include the first insulating layer 510, the insulating pattern layer, the second insulating layer 530, and the third insulating layer 540.

The first conductive layer 100 may be disposed on the circuit element layer CCL. The first conductive layer 100 may include first and second electrodes RMT1 and RMT2. As already mentioned above, the first electrode RMT1 may include a first electrode stem RMT11 and first electrode branches RMT12, and the second electrode RMT2 may include a second electrode stem RMT21 and second electrode branches RMT22. The first and second electrodes RMT1 and RMT2 may be disposed on the substrate SUB to be spaced apart from each other. The circuit element layer CCL may include a via layer, but the disclosure is not limited thereto. The first conductive layer 100 may be disposed directly on the via layer without the aid of a bank.

The first and second electrodes RMT1 and RMT2 may be disposed on the same plane or layer. The distance from one surface (or the top surface) of the substrate SUB to the top surface of the first electrode RMT1 and the distance from one surface (or the top surface) of the substrate SUB to the top surface of the second electrode RMT2 may be substantially equal to each other.

The first conductive layer 100 may include a transparent conductive material. For example, the first conductive layer 100 may include indium tin oxide (ITO), indium zinc oxide (IZO), or indium tin zinc oxide (ITZO). The first conductive layer 100 may have a stack structure such as ITO/silver (Ag)/ITO, ITO/Ag/IZO, or ITO/Ag/ITZO/IZO or may include an alloy of aluminum (Al), nickel (Ni), or lanthanum (La).

The first insulating layer 510 may be disposed on the first conductive layer 100. The first insulating layer 510 may be disposed on parts of the circuit element layer CCL exposed by the first conductive layer 100. The first insulating layer 510 may be disposed to expose at least parts of the first and second electrodes RMT1 and RMT2. The first insulating layer 510 may be disposed on the entire surface of the substrate SUB and may include openings OP, which expose at least parts of the first and second electrodes RMT1 and RMT2.

For example, the openings OP may overlap the first and second electrode stems RMT11 and RMT21 of the first and second electrodes RMT1 and RMT2 in the third direction DR3. The openings OP may not overlap the first electrode branches RMT12 and the second electrode branches RMT22 in the third direction DR3. Accordingly, the first insulating layer 510 may completely cover the first electrode branches RMT12 and the second electrode branches RMT22 in the third direction DR3 but may expose at least parts of the first and second electrode stems RMT11 and RMT21 in the third direction DR3. The parts of the first and second electrode stems RMT11 and RMT21, exposed by the openings OP, may be in physical contact with first and second contact electrodes CTE1 and CTE2.

A height difference may be formed in the first insulating layer 510 so that part of the top surface of the first insulating layer 510 may be recessed between the first and second electrode stems RMT12 and RMT22. Part of the top surface of the first insulating layer 510 may be recessed due to any height difference in the underlying elements, but the disclosure is not limited thereto. As another example, no height difference may be formed in the first insulating layer 510.

The first insulating layer 510 may protect the first and second electrodes RMT1 and RMT2 and may insulate the first and second electrodes RMT1 and RMT2 from each other. Also, the first insulating layer 510 may prevent light-emitting elements ED, which are disposed on the first insulating layer 510, from being placed in direct contact with, and damaged by, other elements.

The first insulating layer 510 may include an inorganic insulating material. For example, the first insulating layer 510 may include an inorganic insulating material such as $SiO_x$, $SiN_x$, $SiO_xN_y$, $Al_2O_3$, or AlN.

The bank BK may be disposed on the first insulating layer 510. At least part of the bank BK may protrude from the top surface of the sub state SUB. The part of the bank BK that protrudes may have inclined side surfaces. The bank BK may be formed to have a higher level than barriers 522 and fixers 521 of the insulating pattern layer that will be described below. The term "level," as used herein, may be defined as the shortest distance from one surface (or the top surface) of the substrate SUB to the substantial top surface of each element. The bank BK may prevent ink from spilling over between adjacent subpixels SPXn during an inkjet printing process performed during the fabrication of the display device 1. The bank BK may separate subpixels SPXn and may thus prevent ink having the light-emitting elements ED scattered therein from being mixed together across the subpixels SPXn.

The side surfaces of the bank BK are illustrated as being linearly inclined, but the disclosure is not limited thereto. As another example, the side surfaces (or the outer surfaces) of the bank BK may have a semicircular or semielliptical shape with curvature. In one embodiment, the bank BK may include an organic insulating material such as polyimide (PI), but the disclosure is not limited thereto.

The light-emitting elements ED may be disposed on the first insulating layer 510. The light-emitting elements ED may be disposed on the first insulating layer 510, between the first and second electrodes RMT1 and RMT2. Specifically, both ends of each of the light-emitting elements ED may be disposed on first and second electrode branches RMT12 and RMT22 of each unit branch.

The light-emitting elements ED may include active layers 33 and may thus emit light of a particular wavelength range. The display device 1 may include light-emitting elements ED that emit light of different wavelength ranges. Accordingly, the first, second, and third subpixels SPX1, SPX2, and SPX3 may emit light of the first, second, and third colors, respectively, but the disclosure is not limited thereto. As another example, the light-emitting elements ED may include active layers 33 that include the same material and may emit light of substantially the same color.

Referring to FIGS. 6 and 7, insulating patterns 520 may be disposed on the first insulating layer 510. As already mentioned above, the insulating patterns 520 may be patterned on the first insulating layer 510 to be spaced apart from one another. The insulating patterns 520 may include a fixer 521, a barrier 522, and a first region 523. The fixer 521, the barrier 522, and the first region 523 may be formed by the same process.

The fixer 521 may be disposed on part of the light-emitting element ED. The fixer 521 may be disposed on the light-emitting element ED not to cover both ends of the light-emitting element ED. The fixer 521 may be disposed to surround the outer surfaces of the light-emitting element ED. Thus, the fixer 521 can protect the light-emitting element ED, and at the same time, fix the light-emitting element ED not to be lost during the fabrication of the display device 1.

The fixer 521 may include a top surface, a bottom surface, and side surfaces. The bottom surface of the fixer 521 may be disposed on side surfaces of a light-emitting element ED. The top surface of the fixer 521 may be opposite to the bottom surface of the fixer 521. The distance between the top surface and the bottom surface of the fixer 521 may be substantially uniform so that the fixer 521 may generally have a uniform thickness.

The barrier 522 may be disposed to surround the light-emitting element ED in a plan view. The barrier 522 may change the traveling direction of light emitted from both ends of the light-emitting element ED to the upward direction, which is the display direction of the display device 1.

The barrier 522 may include a top surface, a bottom surface, and side surfaces. The bottom surface of the barrier 522 may be placed on one surface of a first insulating layer 510. The top surface of the barrier 522 may be opposite to the bottom surface of the barrier 522. Height differences may be formed on the top surfaces and the bottom surface of the barrier 522 due to the presence of any height difference in the elements disposed below the barrier 522. The distance between the top surface and the bottom surface of the barrier 522 may be substantially uniform so that the barrier 522 may generally have a uniform thickness.

The inner side surfaces of the barrier 522 may face both ends of the light-emitting element ED. The side surfaces of the barrier 522 may be inclined at a predetermined angle θ with respect to the bottom surface of the barrier 522, but the disclosure is not limited thereto. For example, the angle θ may be about 75° to about 85°.

As already mentioned above, the fixer 521 and the barrier 522 may be formed by the same process. The fixer 521 and the barrier 522 may have the same thickness. A thickness h21 of the fixer 521 (i.e., the average distance, in the third direction DR3, between the bottom surface of the fixer 521 and the top surface of the fixer 521) may be equal to a thickness h22 of the barriers (i.e., the average distance, in the third direction DR3, between the bottom and top surfaces of the barrier 522), but the disclosure is not limited thereto. As another example, the thickness h21 may differ from the thickness h22.

The thickness h22 may be greater than the diameter of the light-emitting element ED. In this case, light emitted from the light-emitting element ED can be effectively prevented from leaking out of an emission area EMA. For example, the thickness h22 may be about 7500 Å to about 8500 Å.

The first region 523 may be disposed in a recess in the first insulating layer 510 below the light-emitting element ED. The first region 523 may be formed in the process of forming an insulating pattern layer including the insulating patterns 520.

The insulating patterns 520 may include an inorganic insulating material. For example, the insulating patterns 520 may include an inorganic insulating material such as $SiO_x$, $SiN_x$, $SiO_xN_y$, $Al_2O_3$, or AlN.

The second conductive layer 200 may be disposed on the insulating patterns 520. The second conductive layer 200 may include a first contact electrode CTE1. The first contact electrode CTE1 may include a first contact electrode stem CTE11 and a first contact electrode branch CTE12.

The first contact electrode stem CTE11 may be disposed on a first electrode stem RMT11 of a first electrode RMT1. The first contact electrode stem CTE11 may be in electrical contact with parts of the top surface of the first electrode stem RMT11, exposed by the openings OP of the first insulating layer 510.

The first contact electrode branch CTE12 may be disposed on a first electrode branch RMT12 of the first electrode RMT1. The first contact electrode branch CTE12 may be disposed on the barrier 522, a first end of the light-emitting element ED, and the fixer 521, on the first electrode branch RMT12.

The first contact electrode branch CTE12 may be disposed to cover a side surface and part of the top surface of the barrier 522 that are disposed on the first electrode branch RMT12. The first contact electrode branch CTE12 may be in electrical contact with the first end of the light-emitting element ED, exposed by a first hole HAL The first contact electrode branch CTE12 may be disposed on the first end of the light-emitting element ED and may extend to be arranged on a side surface and at least part of the top surface of the fixer 521.

The first contact electrode stem CTE11 of the first contact electrode CTE1 may be in electrical contact not only with part of the first electrode stem RMT11 exposed by one of the openings OP of the first insulating layer 510, but also with the first end of the light-emitting element ED, exposed by the first hole HAL Since the first contact electrode CTE1 is in electrical contact with the first electrode RMT1 and with the first end of the light-emitting element ED, the first electrode RMT1 and the light-emitting element ED can be electrically connected.

The second insulating layer 530 may be disposed on the second conductive layer 200. For example, the second insulating layer 530 may be disposed on the first contact electrode CTE1. The second insulating layer 530 may electrically insulate the first contact electrode CTE1 and a second contact electrode CTE2 from each other. The second insulating layer 530 may be disposed to cover the first contact electrode CTE1 and may not be disposed on a second end of the light-emitting element ED so that the light-emitting element ED may be in electrical contact with the second contact electrode CTE2. The second insulating layer 530 may be in part in electrical contact with the first contact electrode CTE1 and the fixer 521, on the top surface of the fixer 521. A side surface of the second insulating layer 530 on the fixer 521 may be aligned with a side surface of the fixer 521.

The third conductive layer 300 may be disposed on the second insulating layer 530. The third conductive layer 300 may include the second contact electrode CTE2. The second contact electrode CTE2 may include a second contact electrode stem CTE21 and a second contact electrode branch CTE22.

The second contact electrode stem CTE21 may be disposed on a second electrode stem RMT21 of a second electrode RMT2. The second contact electrode stem CTE21 may be in electrical contact with the top surface of the second electrode stem RMT21, exposed by one of the openings OP of the first insulating layer 510.

The second contact electrode branch CTE22 may be disposed on a second electrode branch RMT22 of the second electrode RMT2. The second contact electrode branch CTE22 may be disposed on the barrier 522, a second end of the light-emitting element ED, and part of the second insulating layer 530 on the fixer 521, on the second electrode branch RMT22.

The second contact electrode branch CTE22 may be disposed to cover a side surface and part of the top surface of the barrier 522 that are disposed on the second electrode branch RMT22. The second contact electrode branch CTE22 may be in electrical contact with the second end of the light-emitting element ED, exposed by a second hole HA2. The second contact electrode branch CTE22 may be disposed on the second end of the light-emitting element ED and may extend to be arranged on at least part of the second insulating layer 530 that is disposed on the side surface and the top surface of the fixer 521.

The second contact electrode stem CTE21 of the second contact electrode CTE2 may be in electrical contact with part of the second electrode stem RMT21 exposed by one of the openings OP of the first insulating layer 510 and may also be in electrical contact with the second end of the light-emitting element ED, exposed by the second hole HA2. Since the second contact electrode CTE2 is in electrical contact with the second electrode RMT2 and with the second end of the light-emitting element ED, the second electrode RMT2 and the light-emitting element ED can be electrically connected.

The first and second contact electrodes CTE1 and CTE2 may include a conductive material. For example, the first and second contact electrodes CTE1 and CTE2 may include Al. For example, the first and second contact electrodes CTE1 and CTE2 may include ITO, IZO, ITZO, or Al. For example, the first and second contact electrodes CTE1 and CTE2 may include a transparent conductive material, and light emitted from the light-emitting element ED may travel toward the side surfaces of the barrier 522 through the first and second contact electrodes CTE1 and CTE2. Light emitted from the light-emitting element ED toward the side surfaces of the barrier 522 may be reflected in the upward direction by the reflective layer 400.

The reflective layer 400 may be disposed on the first and second contact electrodes CTE1 and CTE2. The reflective layer 400 may include a first reflective layer 410, which is disposed on the first contact electrode CTE1, and a second reflective layer 420, which is disposed on the second contact electrode CTE2.

The first reflective layer 410 may be disposed on a side surface of the barrier 522 that forms the first hole HA1. The first reflective layer 410 may be in contact with part of the second insulating layer 530 on the side surface of the barrier 522 that forms the first hole HA1. The first reflective layer 410 may face the first end of the light-emitting element ED and may be disposed to cover the side surface of the barrier 522 that forms the first hole HA1. The first reflective layer 410 may extend outwardly from the side surface of the barrier 522 that forms the first hole HA1 to be arranged on at least part of the top surface of the barrier 522.

The second reflective layer 420 may be disposed on a side surface of the barrier 522 that forms the second hole HA2. The second reflective layer 420 may be in contact with part of the second contact electrode branch CTE22 on the side surface of the barrier 522 that forms the second hole HA2. The second reflective layer 420 may face the second end of the light-emitting element ED and may be disposed to cover the side surface of the barrier 522 that forms the second hole HA2. The second reflective layer 420 may extend outwardly from the side surface of the barrier 522 that forms the second hole HA2 to be arranged on at least part of the top surface of the barrier 522.

To reflect light emitted from the light-emitting element ED, the reflective layer 400 may include a material with high reflectivity. For example, the reflective layer 400 may include a material such as Ag or Al, but the disclosure is not limited thereto.

Referring to FIG. 7, light L emitted from the light-emitting element ED may travel toward parts of the reflective layer 400 on the barrier 522. The light L may then be reflected by the reflective layer 400 so that the traveling direction of the light L may be changed into the upward direction, which is the display direction of the display device 1.

Referring again to FIG. 6, the third insulating layer 540 may be disposed on the entire surface of the substrate SUB. The third insulating layer 540 may protect elements disposed on the substrate SUB from an external environment. The third insulating layer 540 may include an inorganic insulating material or an organic insulating material. For example, the third insulating layer 540 may include an inorganic insulating material such as $SiO_x$, $SiN_x$, $SiO_xN_y$, $Al_2O_3$, or AlN. In another example, the third insulating layer 540 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the disclosure is not limited to these examples.

A method of manufacturing the display device 1 will hereinafter be described with reference to the other drawings.

FIGS. 8 through 14 are schematic cross-sectional views illustrating a method of manufacturing a display device according to an embodiment of the disclosure.

Figure 8:
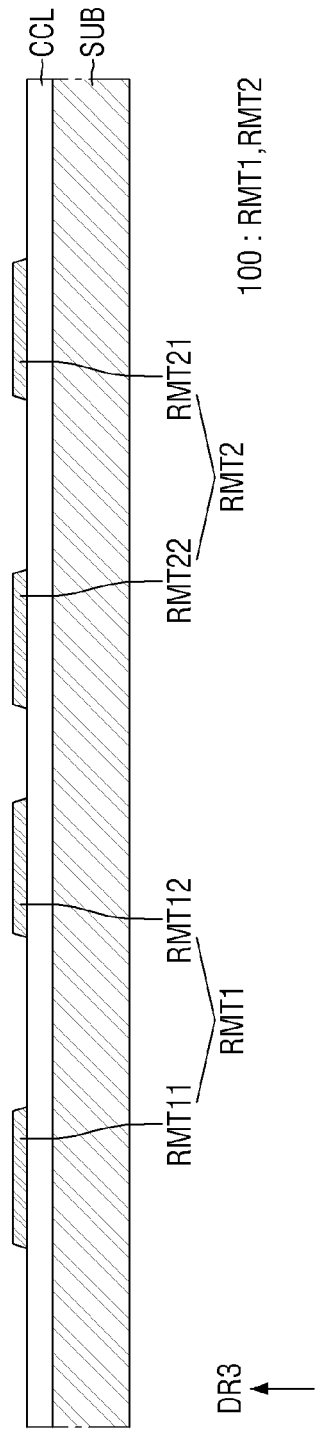
FIGS. 8 through 14 are schematic cross-sectional views illustrating a method of manufacturing a display device according to an embodiment of the disclosure.

Referring to FIG. 8, a substrate SUB on which a circuit element layer CCL is disposed is prepared. The circuit element layer CCL may include circuit elements that are formed of conductive layers and of insulating layers. A first conductive layer 100 may be formed on the surface of the substrate SUB where the circuit element layer CCL is disposed. The first conductive layer 100 may be formed by a mask process. For example, the first conductive layer 100 may be formed by the same mask process as first and second electrodes RMT1 and RMT2.

A material layer for forming the first conductive layer 100 is deposited on the entire surface of the substrate SUB. Thereafter, photoresist patterns are formed by applying a photoresist layer on the material layer for forming the first conductive layer 100 and subjecting the photoresist layer to exposure and development, and etching is performed using the photoresist patterns as an etching mask. Thereafter, the photoresist patterns are removed by a strip or ashing process. Since the first conductive layer 100 may be formed directly on the circuit element layer CCL, the top surface of the material layer for forming the first conductive layer 100 may be substantially on a single plane without any height difference thereon. Thus, the thickness of the photoresist layer may be uniform, and the amount of exposure can be prevented from increasing during the exposure and development of the photoresist layer. As a result, fine patterns of the first conductive layer 100 can be formed or adjusted.

Figure 9:
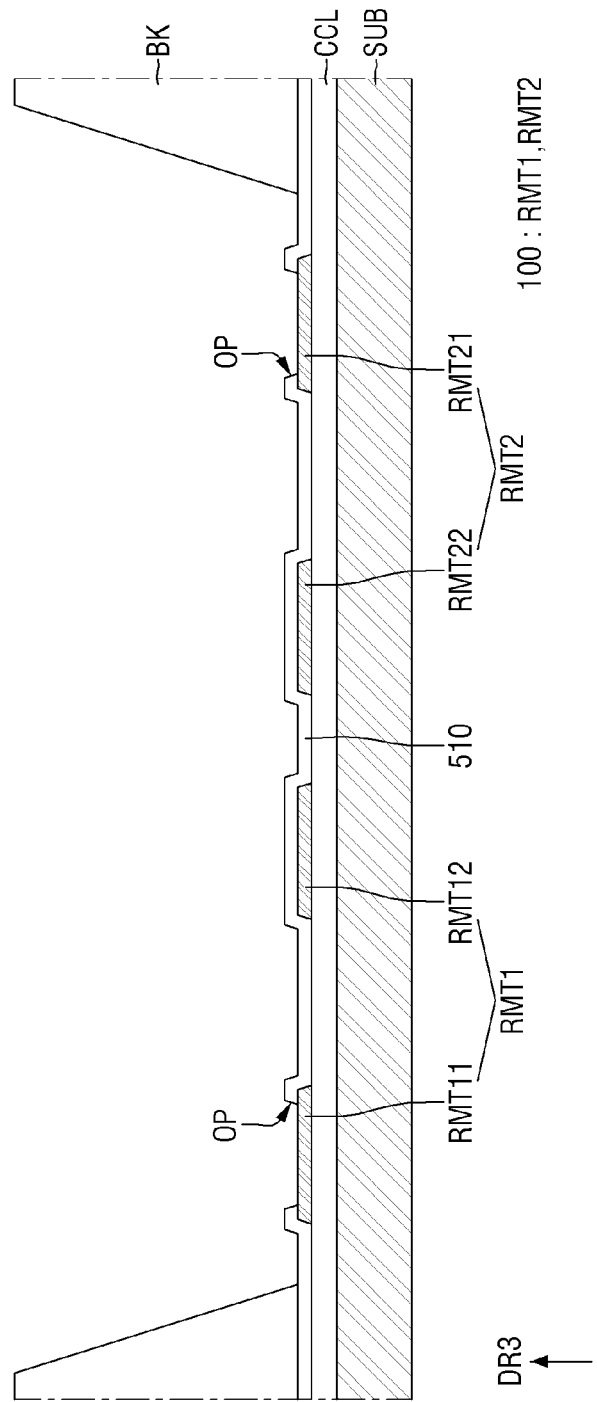

Thereafter, referring to FIG. 9, a first insulating layer 510 is formed on the first conductive layer 100, i.e., the circuit element layer CCL where the first and second electrodes RMT1 and RMT2 are formed. The first insulating layer 510 may include openings OP, which expose first and second electrode stems RMT11 and RMT21. The first insulating layer 510 may be formed by placing a material layer for forming the first insulating layer 510 on the substrate SUB and removing parts of the material layer. For example, the first insulating layer 510 may be formed by dry etching. Thereafter, a bank BK is formed on the first insulating layer 510.

Figure 10:
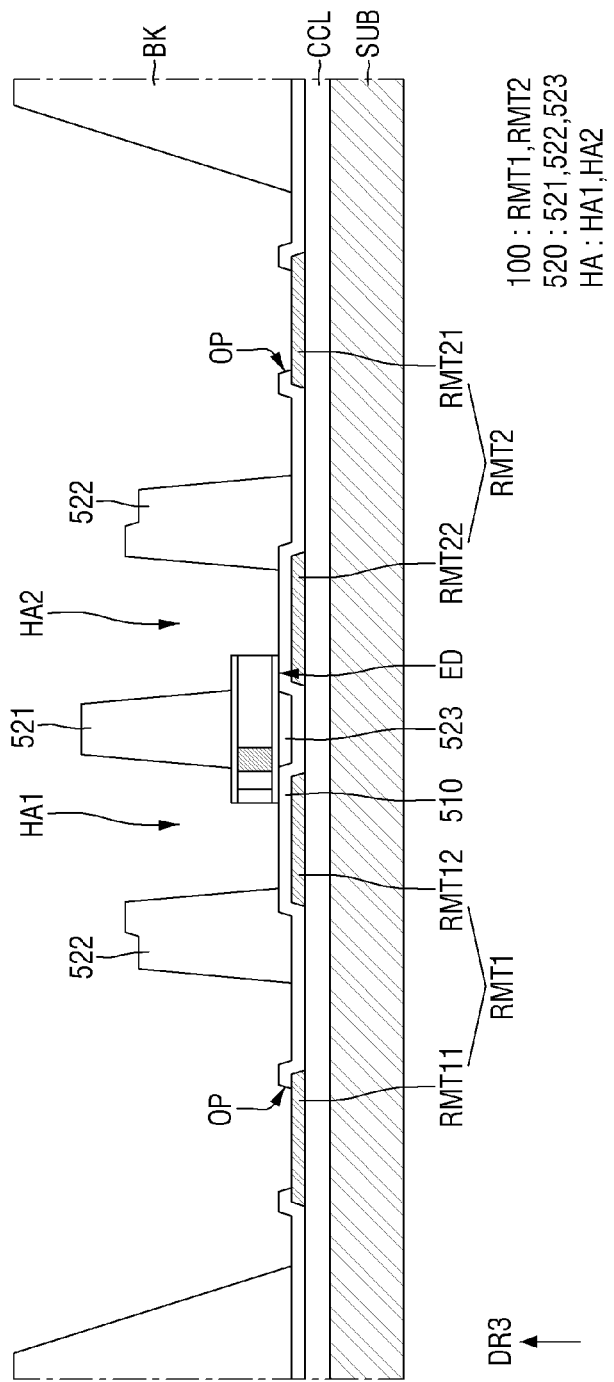
Figure 11:
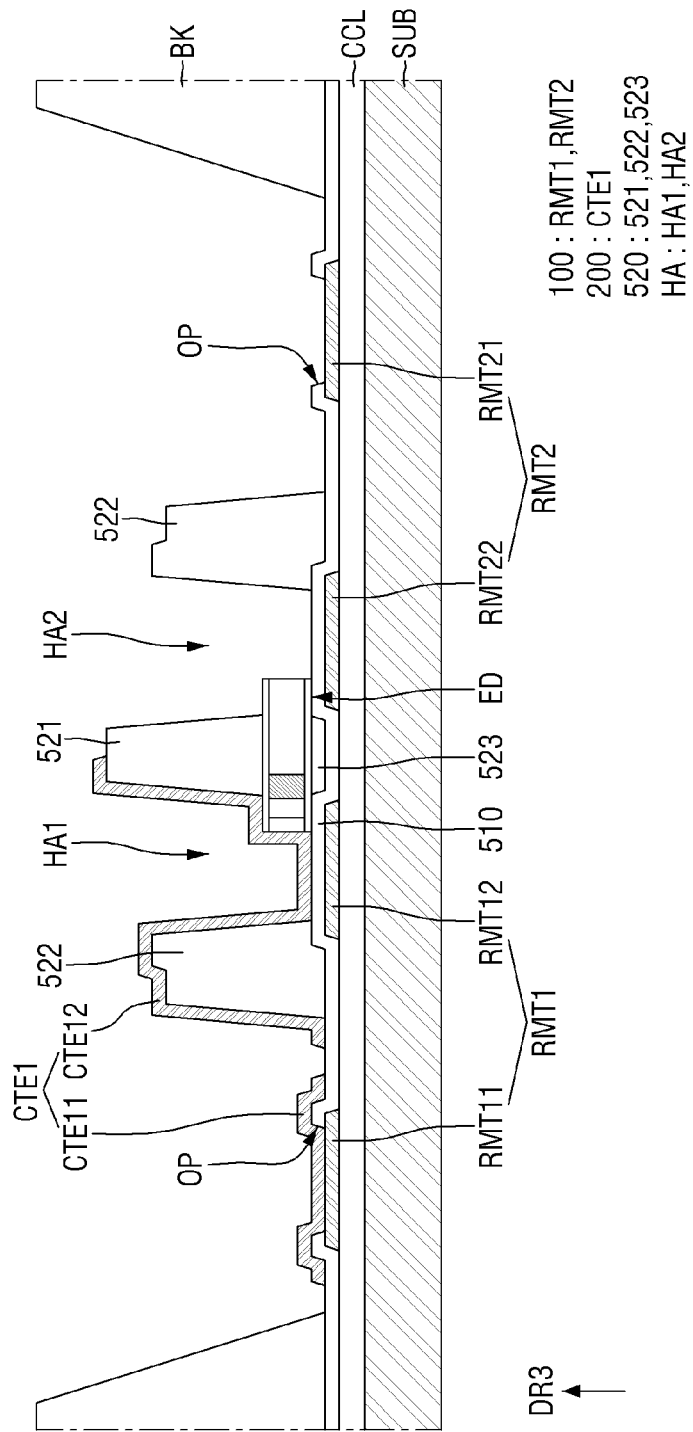
Figure 12:
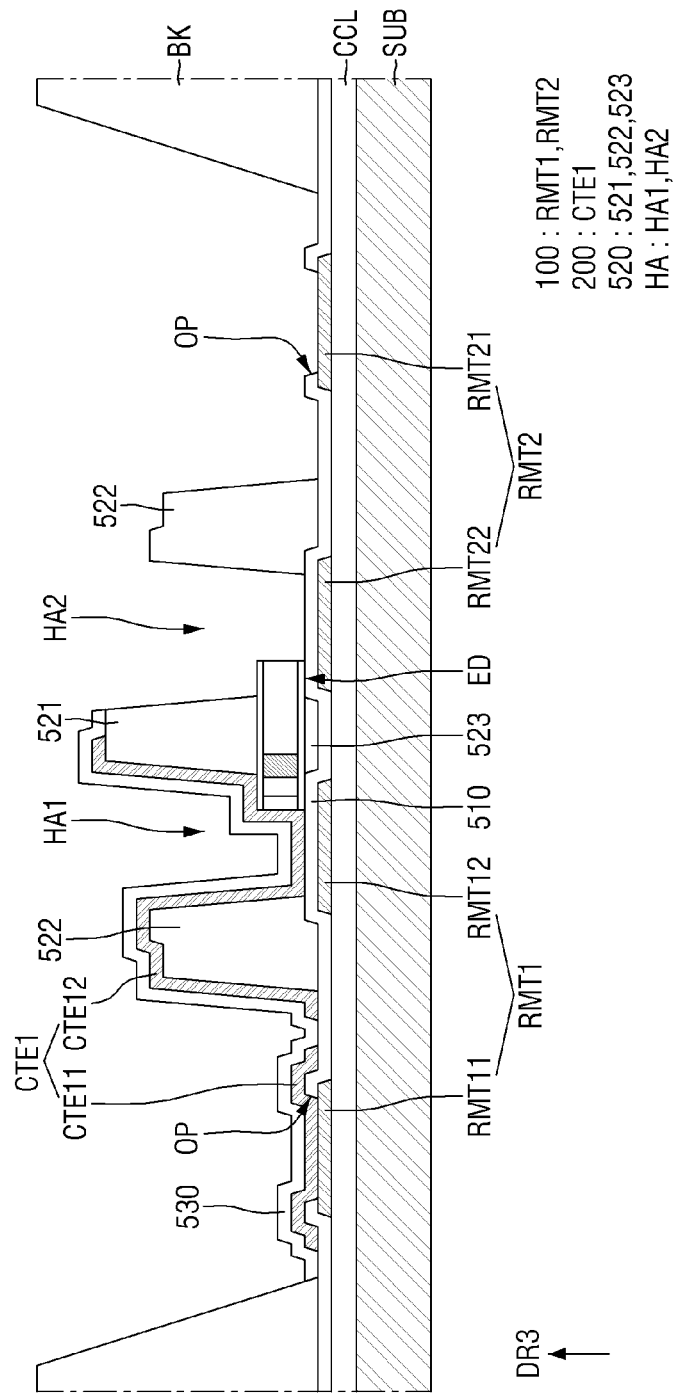
Figure 13:
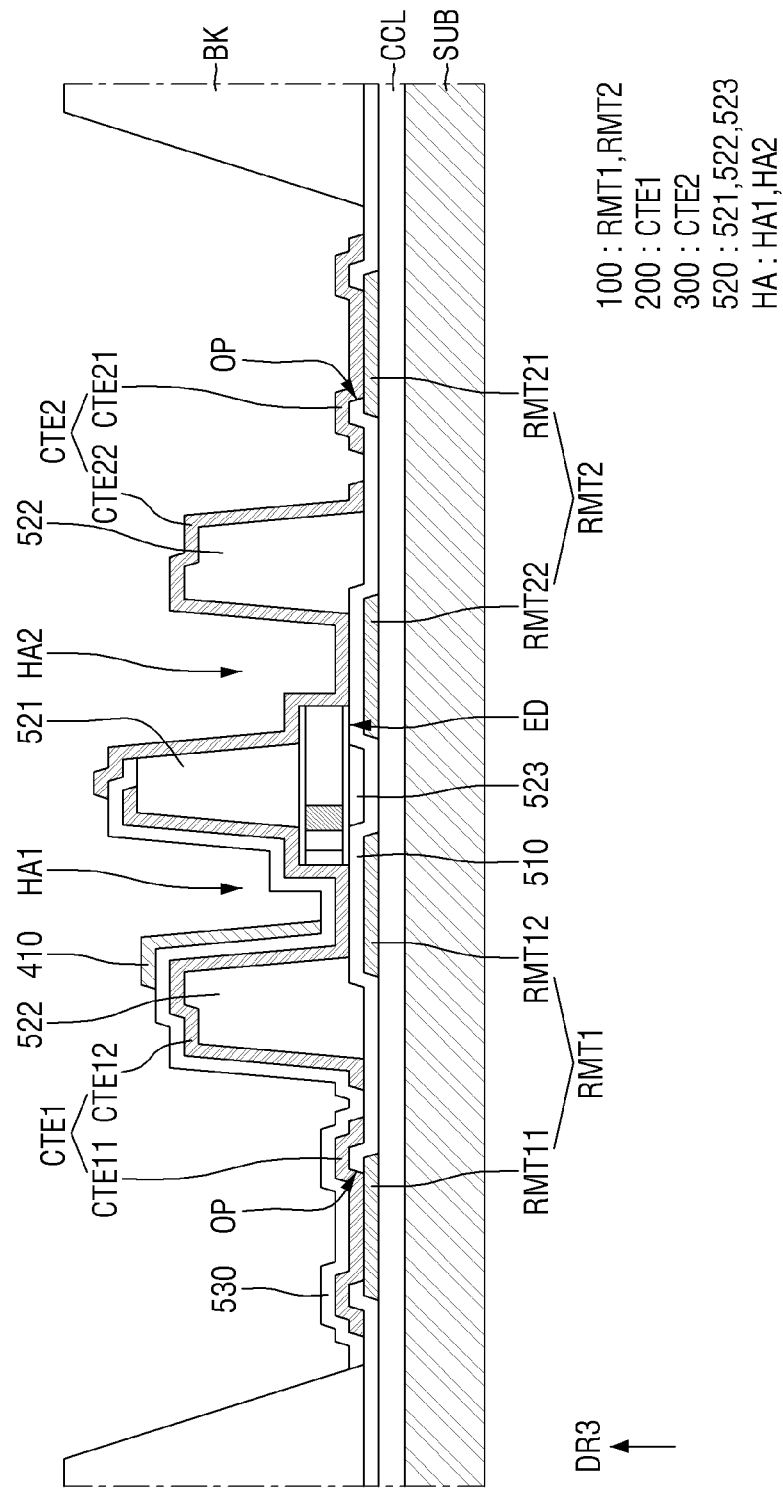
Figure 14:
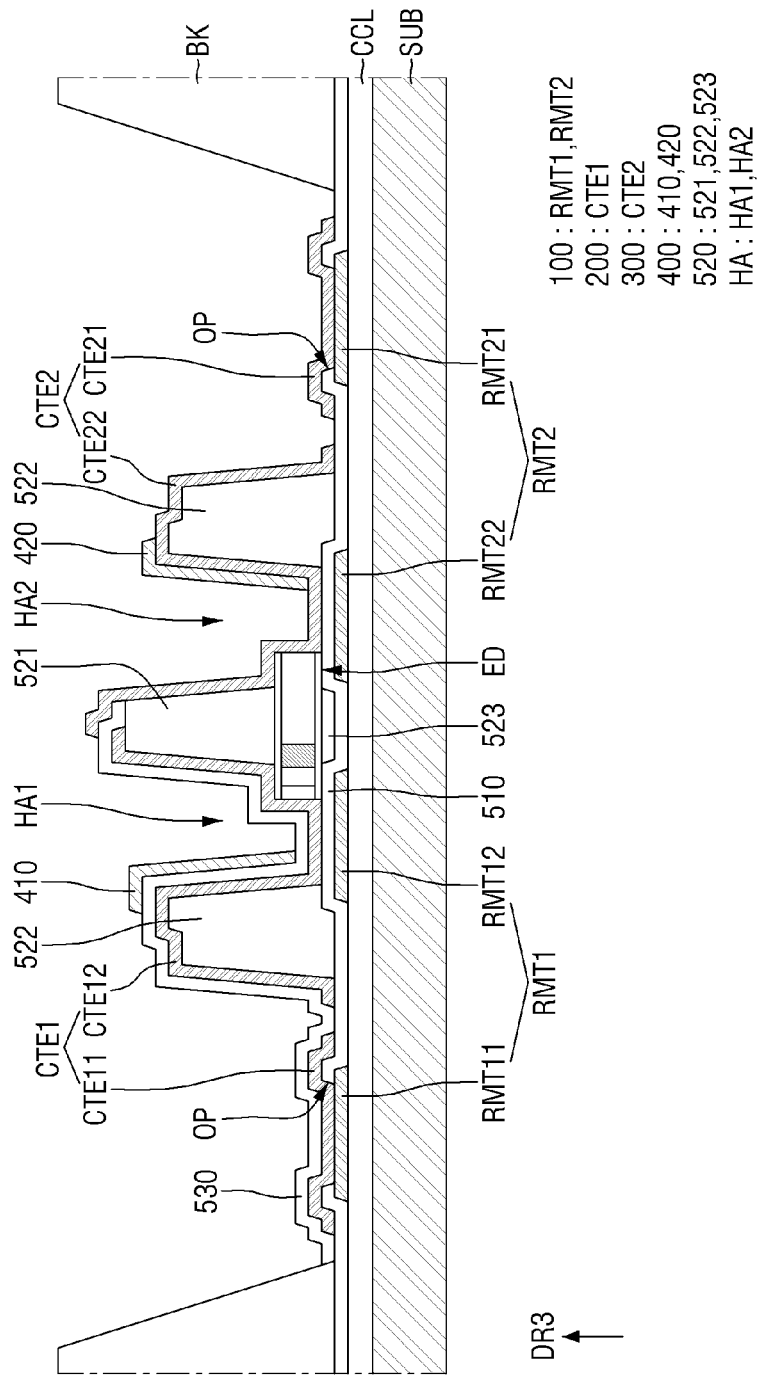

Thereafter, referring to FIG. 10, a light-emitting element ED is disposed between the first and second electrodes RMT1 and RMT2. Ink having the light-emitting element ED scattered therein may be sprayed onto the substrate SUB by a printing process using an inkjet printing device. The ink sprayed by the inkjet printing device may be settled in a region surrounded by the bank BK. The bank BK may prevent the ink from spilling over to other subpixels SPXn.

Thereafter, an insulating pattern layer is formed. The insulating pattern layer may be disposed in a region corresponding to the light-emitting element ED. The insulating pattern layer may be formed by depositing an insulating material including an inorganic material on the substrate SUB. The insulating pattern layer may be formed and patterned by a single mask process. Thus, a fixer 521, a barrier 522, and a first region 523 of the insulating pattern layer may be formed by a single mask process.

Thereafter, referring to FIGS. 11 through 14, a second conductive layer 200 is formed on the substrate SUB where the insulating pattern layer is formed. The second conductive layer 200 may include a first contact electrode CTE1 and may be formed by wet etching. A second insulating layer 530 is formed on the substrate SUB where the second conductive layer 200 is formed. Thereafter, a third conductive layer 300 is formed on the substrate SUB where the second insulating layer 530 is formed. The third conductive layer 300 may include a second contact electrode CTE2 and may be formed by wet etching. Thereafter, a reflective layer 400 is formed on the substrate SUB where the third conductive layer 300 is formed. Thereafter, a third insulating layer 540 is formed on the substrate SUB where the reflective layer 400 is formed, thereby obtaining the display device 1 of FIG. 6.

Display devices according to other embodiments of the disclosure will hereinafter be described with reference to other drawings, focusing mainly on the display device 1 of FIG. 6.

Figure 15:
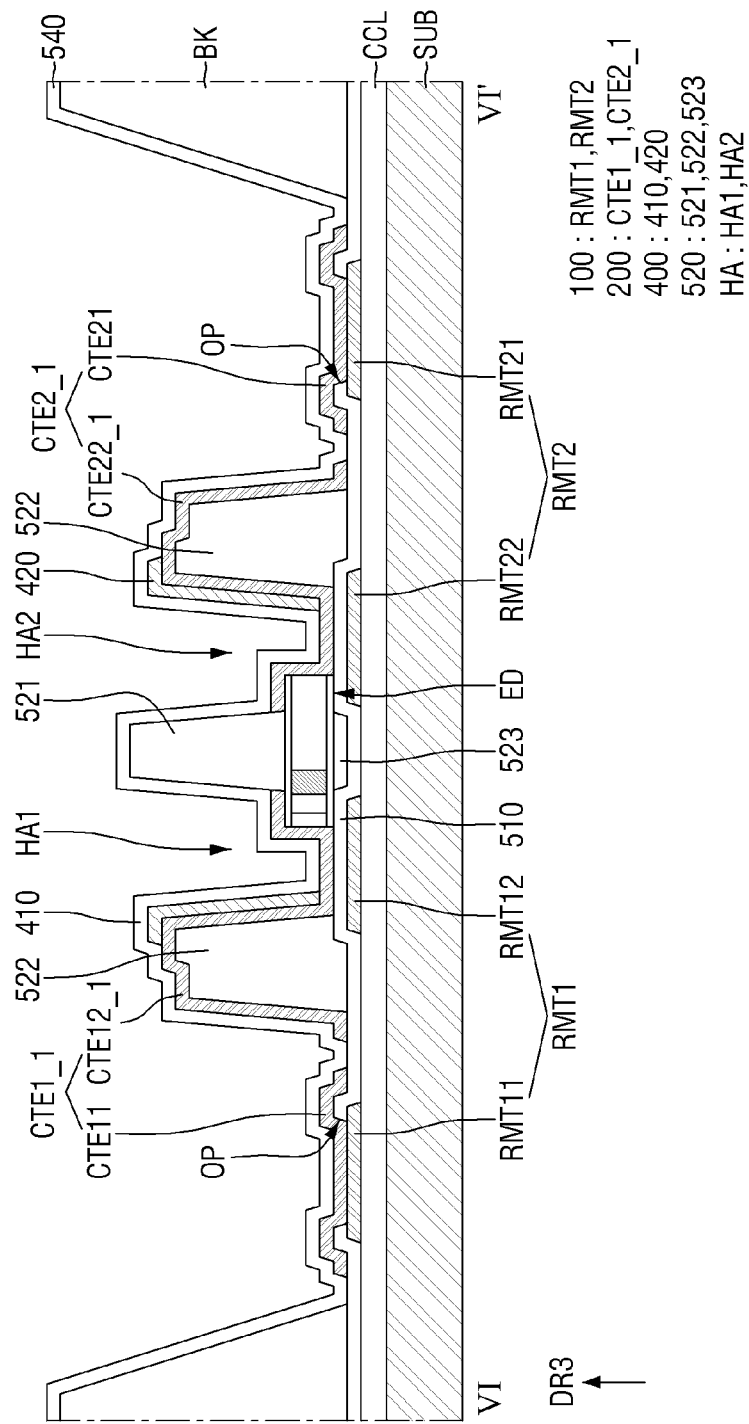
FIG. 15 is a schematic cross-sectional view, taken along line VI-VI' of FIG. 2, of a display device according to another embodiment of the disclosure.

FIG. 15 is a cross-sectional view, taken along line VI-VI' of FIG. 2, of a display device according to another embodiment of the disclosure. The display device of FIG. 15 differs from the display device 1 of FIG. 6 at least in that first and second contact electrodes are formed of the same conductive layer.

Referring to FIG. 15, a second conductive layer 200 may include first and second contact electrodes CTE1_1 and CTE2_1. The first and second contact electrodes CTE1_1 and CTE2_1 may be formed and patterned by the same mask process.

A first contact electrode branch CTE12_1 of the first contact electrode CTE1_1 may be in electrical contact with a first end of a light-emitting element ED. The first contact electrode branch CTE12_1 may be disposed to not overlap a fixer 521. A first reflective layer 410 may be disposed directly on the first contact electrode branch CTE12_1.

A second contact electrode branch CTE22_1 of the second contact electrode CTE2_1 may be in electrical contact with a second end of the light-emitting element ED. The second contact electrode branch CTE22_1 may be disposed to not overlap the fixer 521. A second reflective layer 420 may be disposed directly on the second contact electrode branch CTE22_1.

The first and second contact electrode branches CTE12_1 and CTE22_1, which are disposed on the light-emitting element ED, may be spaced apart, and electrically insulated, from each other by the fixer 521.

Since the first and second contact electrodes CTE1_1 and CTE2_1 are formed by a single mask process, the number of masks needed can be reduced, and process economics can be improved.

Figure 16:
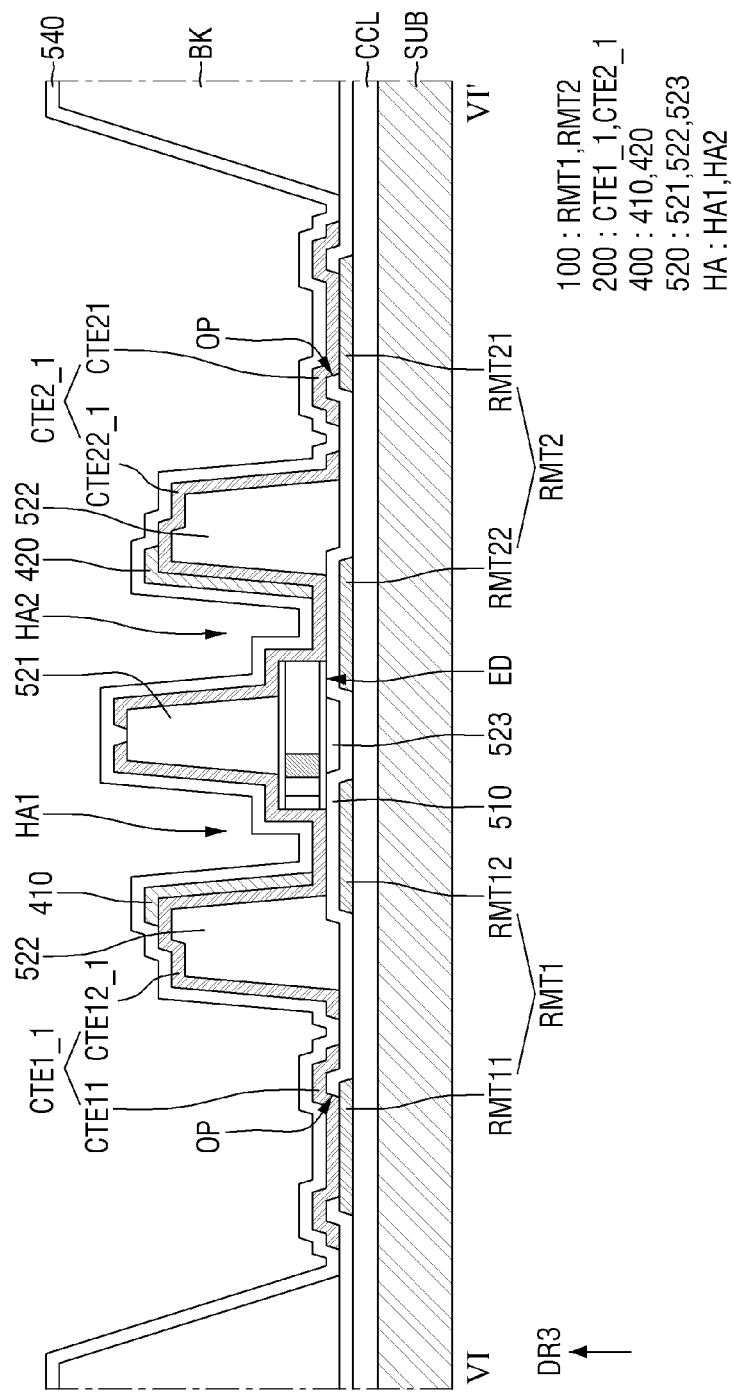
FIG. 16 is a schematic cross-sectional view, taken along line VI-VI' of FIG. 2, of a display device according to another embodiment of the disclosure.

FIG. 16 is a schematic cross-sectional view, taken along line VI-VI' of FIG. 2, of a display device according to another embodiment of the disclosure. The display device of FIG. 16 differs from the display device of FIG. 15 at least in that first and second contact electrodes CTE1_1 and CTE2_1 are disposed on the top surface of a fixer 521 to be spaced apart from each other.

Referring to FIG. 16, a first contact electrode branch CTE12_1 of a first contact electrode CTE1_1 may be disposed on a first end of a light-emitting element ED and may extend from the first end of the light-emitting element ED to a fixer 521 to be arranged on the top surface of a fixer 521.

Similarly, a second contact electrode branch CTE22_1 of a second contact electrode CTE2_1 may be disposed on a second end of the light-emitting element ED and may extend from the second end of the light-emitting element ED to the fixer 521 to be arranged on the top surface of the fixer 521.

Portions of the first and second contact electrode branches CTE12_1 and CTE22_1 that are disposed on side surfaces and the top surface of the fixer 521, may be spaced apart from each other, on the top surface of the fixer 521.

Figure 17:
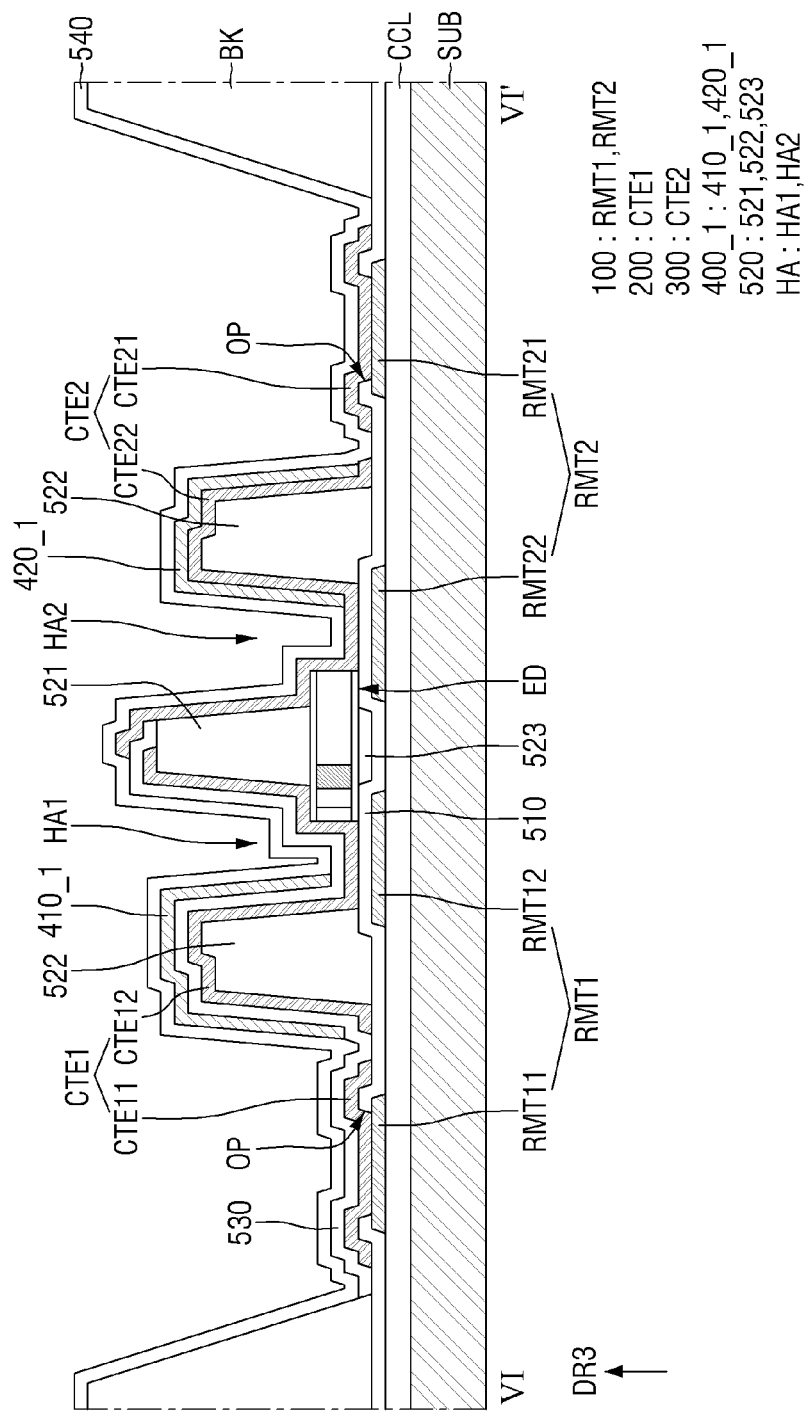
FIG. 17 is a schematic cross-sectional view, taken along line VI-VI' of FIG. 2, of a display device according to another embodiment of the disclosure.

FIG. 17 is a schematic cross-sectional view, taken along line VI-VI' of FIG. 2, of a display device according to another embodiment of the disclosure. The display device of FIG. 17 differs from the display device 1 of FIG. 6 at least in that a reflective layer 400_1 is disposed to completely cover the top surface and side surfaces of a barrier 522.

Referring to FIG. 17, a reflective layer 400_1 may include first and second reflective layers 410_1 and 420_2, which cover the top surface and side surfaces of a barrier 522.

The first reflective layer 410_1 may be disposed on part of the barrier 522 that forms a first hole HA1 which exposes a first end of a light-emitting element ED. The first reflective layer 410_1 may be disposed to cover all the inner side surface, top surface, and outer side surface of the part of the barrier 522 that forms the first hole HA1.

The second reflective layer 420_1 may be disposed on part of the barrier 522 that forms a second hole HA2, which exposes a second end of the light-emitting element ED. The second reflective layer 420_1 may be disposed to cover all the inner side surface, top surface, and outer side surface of the part of the barrier 522 that forms the second hole HA2.

Since the reflective layer 400_1 is disposed not only on the inner side surfaces, but on the top surface of the barrier 522, light that does not travel upward from the light-emitting element ED and is reflected to the top surface of the barrier 522 can be reflected by the reflective layer 400_1, which is disposed on the top surface of the barrier 522, and can thus be emitted in an upward direction.

Figure 18:
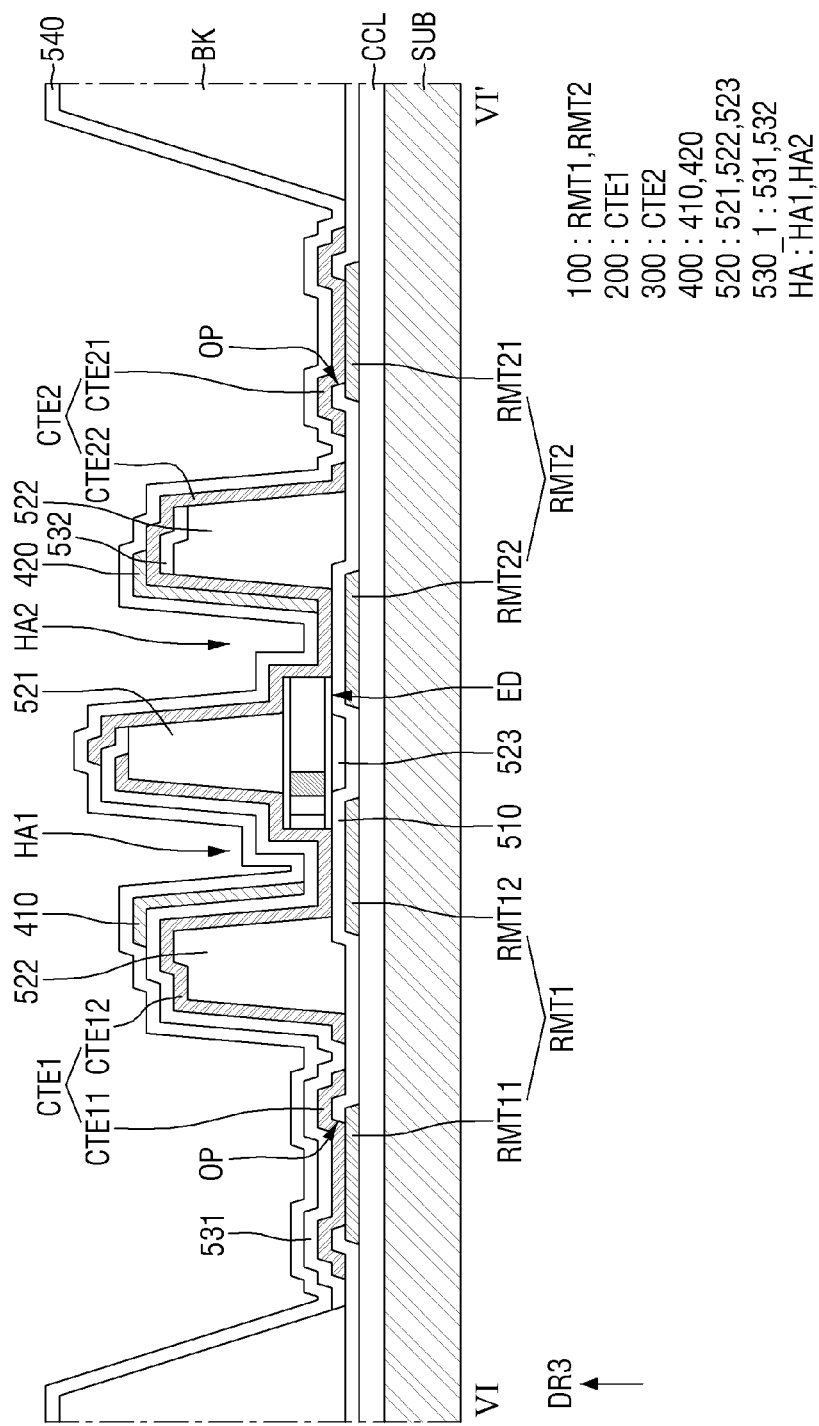
FIG. 18 is a schematic cross-sectional view, taken along line VI-VI' of FIG. 2, of a display device according to another embodiment of the disclosure.

FIG. 18 is a schematic cross-sectional view, taken along line VI-VI' of FIG. 2, of a display device according to another embodiment of the disclosure. The display device of claim 18 differs from the display device 1 of FIG. 6 at least in that a second insulating layer is disposed even on part of a barrier that forms a second hole.

Referring to FIG. 18, a second insulating layer 530_1 may include first and second regions 531 and 532. The first region 531 of the second insulating layer 530_1 may have substantially the same arrangement and structure as the second insulating layer 530 of FIG. 6.

The second region 532 of the second insulating layer 530_1 may be disposed on part of a barrier 522 that forms a second hole HA2. The second region 532 of the second insulating layer 530_1 may be disposed on the top surface of the part of the barrier 522 that forms the second hole HA2. A second contact electrode branch CTE22 of a second contact electrode CTE2 may be in direct contact with the second region 532 of the second insulating layer 530_1.

Since the second insulating layer 530_1 is further disposed on the part of the barrier 522 that forms the second hole HA2, the height of a barrier that serves as a reflective barrier for reflecting light emitted from a light-emitting element ED so that the light can travel upward can be adjusted. The height of the reflective barrier may be the sum of the thickness of the barrier 522 and the thickness of the second insulating layer 530_1. Since the height of the reflective barrier can be increased, the amount of leakage light from the light-emitting element ED can be reduced, and as a result, the luminance of the display device of FIG. 18 can be improved.

Figure 19:
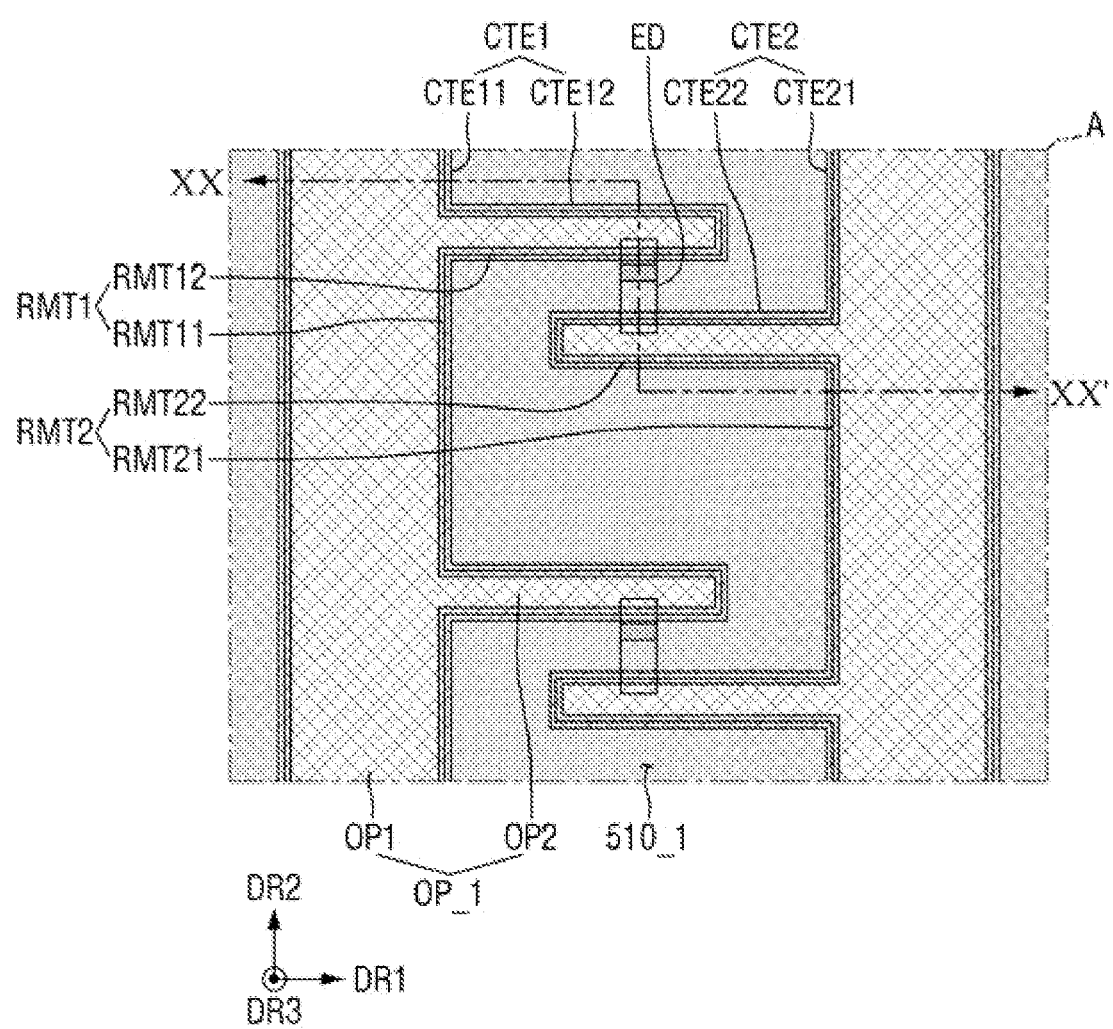
FIG. 19 is a schematic enlarged layout view of an area A (of FIG. 2) of a display device according to another embodiment of the disclosure and illustrates the relative arrangement of first and second electrodes, first and second contact electrodes, light-emitting elements, and a first insulating layer.
Figure 20:
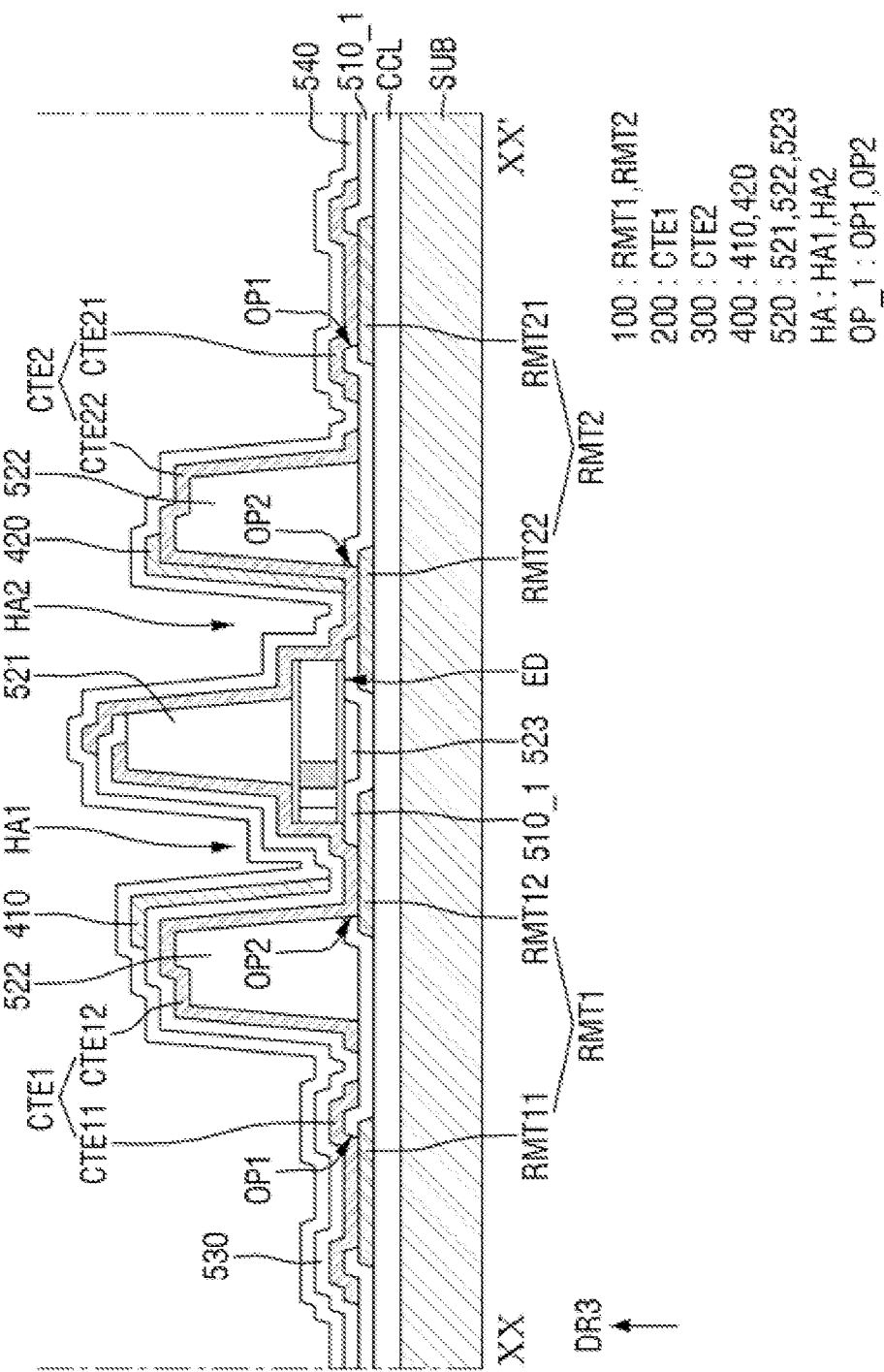
FIG. 20 is a schematic cross-sectional view, taken along line XX-XX' of FIG. 19, of the display device of FIG. 19.

FIG. 19 is a schematic enlarged layout view of an area A of FIG. 2 of a display device according to another embodiment of the disclosure and illustrates the relative arrangement of first and second electrodes, first and second contact electrodes, light-emitting elements, and a first insulating layer. FIG. 20 is a schematic cross-sectional view, taken along line XX-XX' of FIG. 19, of the display device of FIG. 19.

The display device of FIGS. 19 and 20 differs from the display device 1 of FIG. 6 at least in that openings included in a first insulating layer include first openings, which expose at least parts of a first electrode stem, and second openings, which expose at least parts of a second electrode stem.

Referring to FIGS. 19 and 20, a first insulating layer 510_1 may include openings OP_1, and the openings OP_1 include first openings OP1 and second openings OP2. In a plan view, first and second openings OP1 and OP2 that expose parts of a first electrode RMT1 may be formed integrally. Similarly, in a plan view, first and second openings OP1 and OP2 that expose parts of a second electrode RMT2 may be formed integrally. The planar shape of the openings OP_1 may conform to the planar shape of the first and second electrodes RMT1 and RMT2. The openings OP_1 may have a similar planar shape to the first and second electrodes RMT1 and RMT2 and may have a smaller area than the first and second electrodes RMT1 and RMT2.

The first openings OP1 may be disposed on first and second electrode stems RMT11 and RMT21 of first and second electrodes RMT1 and RMT2. The first openings OP1 may have substantially the same shape and arrangement as the openings OP of FIG. 6.

The second openings OP2 may branch off of the first openings OP1. The second openings OP2 may expose at least parts of first electrode branches RMT12 and at least parts of second electrode branches RMT22.

A first contact electrode stem CTE11 of a first contact electrode CTE1 may be in electrical contact with parts of the top surface of the first electrode stem RMT11, exposed by the first openings OP1. Similarly, a second contact electrode stem CTE21 of a second contact electrode CTE2 may be in electrical contact with parts of the top surface of the second electrode stem RMT21, exposed by the first openings OP1.

The first contact electrode branches CTE12 of the first contact electrode CTE1 may be in electrical contact with parts of the top surfaces of the first electrode branches RMT12, exposed by the second openings OP2. Similarly, second contact electrode branches CTE22 of the second contact electrode CTE1 may be in electrical contact with parts of the top surfaces of the second electrode branches RMT22, exposed by the second openings OP2.

The first and second contact electrodes CTE1 and CTE2 can be in electrical contact with parts of the first and second electrodes RMT1 and RMT2, exposed by the first openings OP1 and the second openings OP2. Thus, the first and second contact electrodes CTE1 and CTE2 can be in electrical contact with the first and second electrodes RMT1 and RMT2 in regions that overlap first and second holes HA1 and HA2.

Figure 21:
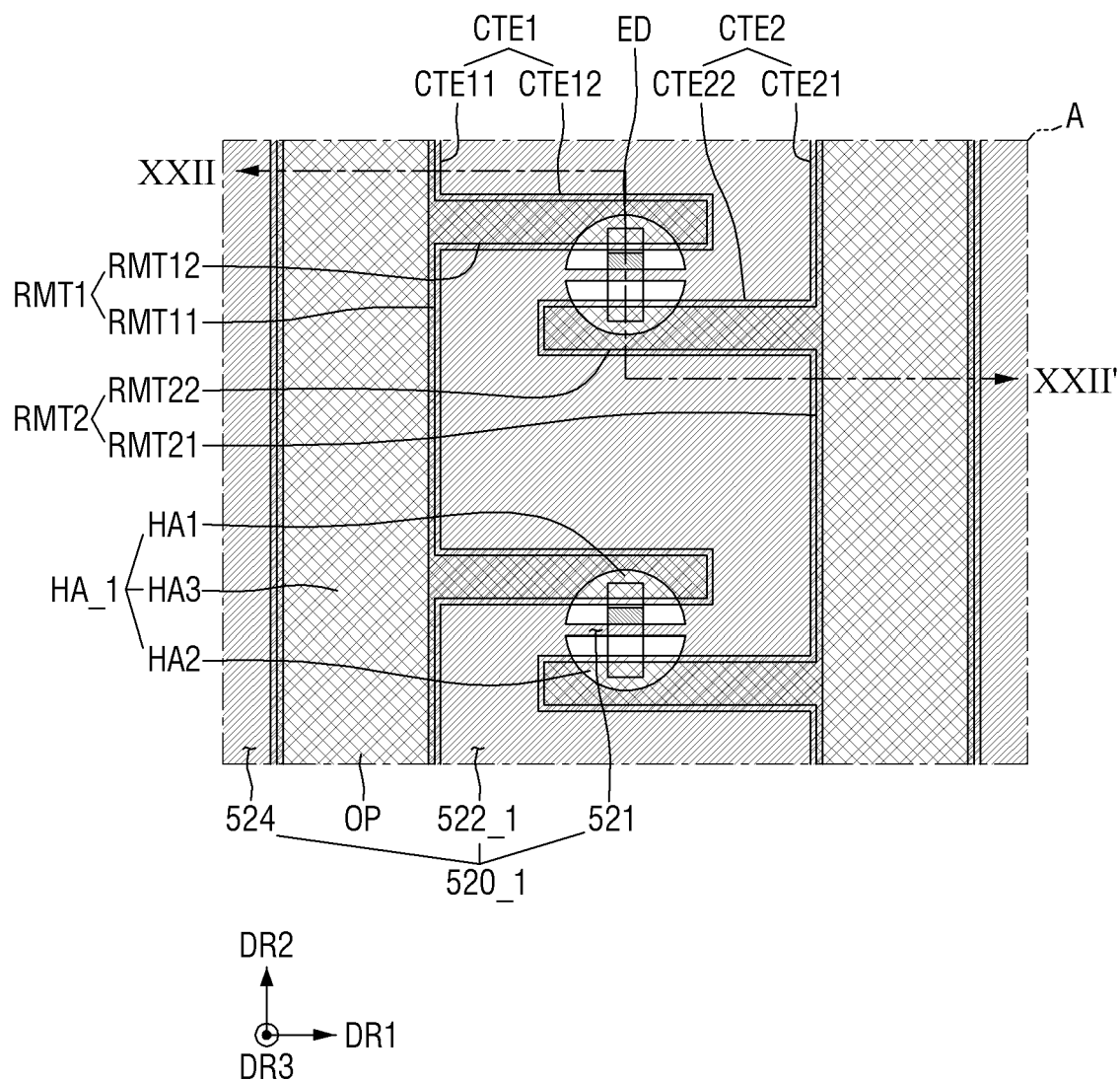
FIG. 21 is a schematic enlarged layout view of an area A (of FIG. 2) of a display device according to another embodiment of the disclosure and illustrates the relative arrangement of first and second electrodes, first and second contact electrodes, light-emitting elements, and insulating patterns.
Figure 22:
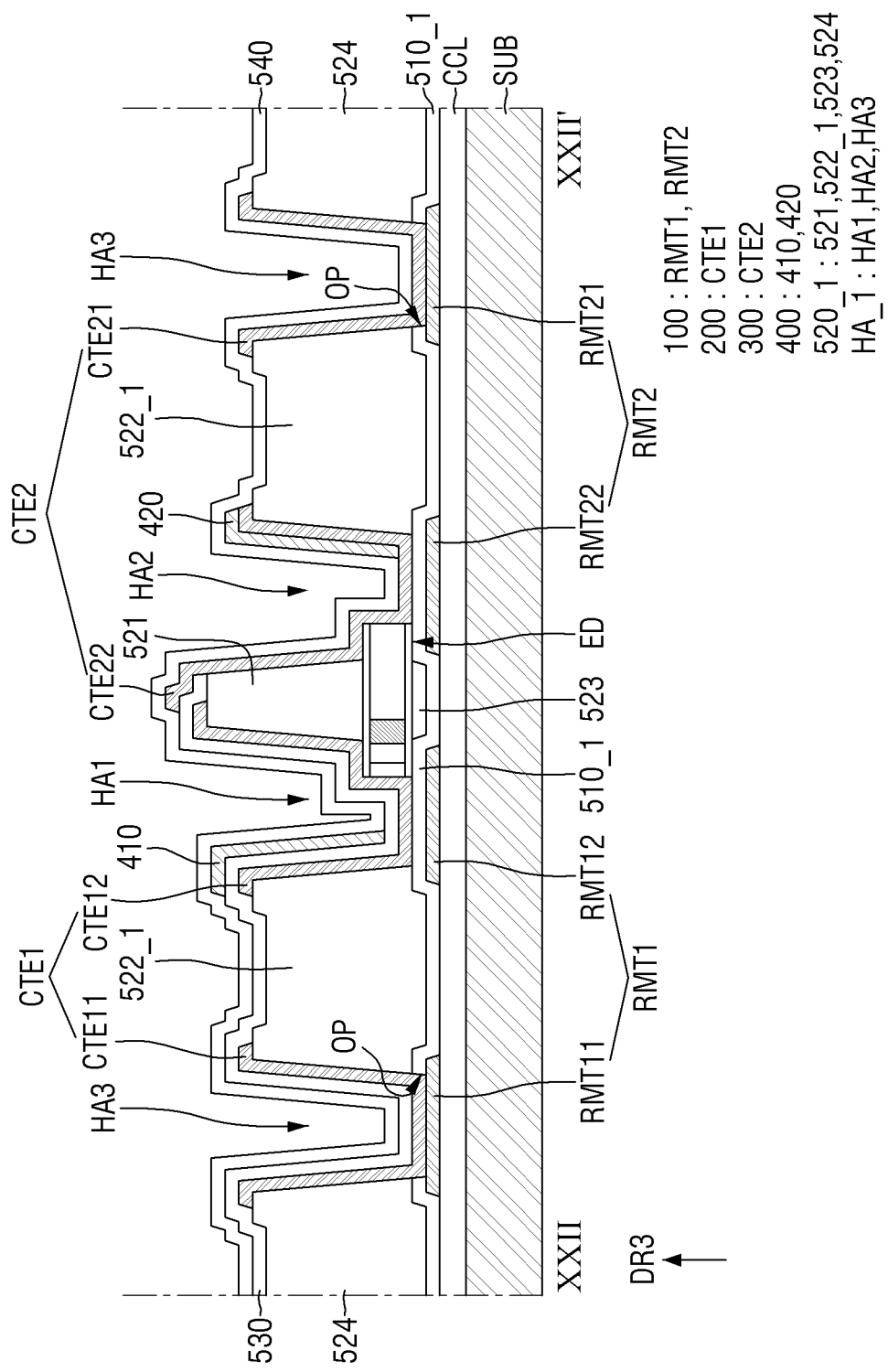
FIG. 22 is a schematic cross-sectional view, taken along line XXII-XXII' of FIG. 21, of the display device of FIG. 21.

FIG. 21 is a schematic enlarged layout view of an area A of FIG. 2 of a display device according to another embodiment of the disclosure and illustrates the relative arrangement of first and second electrodes, first and second contact electrodes, light-emitting elements, and insulating patterns. FIG. 22 is a schematic cross-sectional view, taken along line XXII-XXII' of FIG. 21, of the display device of FIG. 21.

The display device of FIGS. 21 and 22 differs from the display device 1 of FIG. 5 at least in that an insulating pattern layer is disposed on the entire surface of a substrate except for first holes, second holes, and third holes.

Referring to FIGS. 21 and 22, an insulating pattern layer 520_1 may be disposed on the entire surface of a substrate SUB and may include holes HA_1. The holes HA_1 may include first holes HA1 second holes HA2, and third holes HA3. The arrangement and shape of the first holes HA1 and the second holes HA2 may be substantially the same as the arrangement and shape of the first holes HA1 and the second holes HA2 of FIG. 5.

The third holes HA3 may be disposed to overlap first and second electrode stems RMT11 and RMT21 of first and second electrodes RMT1 and RMT2 in a third direction DR3. The third holes HA3 may be holes for providing contact areas where first and second contact electrodes CTE1 and CTE2 and the first and second electrodes RMT1 and RMT2 electrically contact. The third holes HA3 may be disposed to overlap openings OP included in a first insulating layer 510, in the third direction DR3, and side surfaces of layers that form the third holes HA3 may be aligned with side surfaces of the first insulating layer 510 that form the openings OP.

The insulating pattern layer 520_1 may include fixers 521, barriers 522_1, first regions 523, and second regions 524.

The barriers 522_1 may be disposed between the first and second electrode stems RMT11 and RMT21 to surround light-emitting elements ED and may define the first holes HA1 and the second holes HA2 together with the fixers 521. The second regions 524 may be disposed on the outside of the first and second electrode stems RMT11 and RMT21. The second regions 524 may define the third hole HA3 together with the barriers 522_1.

A first contact electrode stem CTE11 of the first contact electrode CTE1 may be in electrical contact with the first electrode stem RMT11 through the third holes HA3. The first contact electrode stem CTE11 may cover or overlap the second regions 524 and side surfaces of the barriers 522_1 and may extend outwardly to be disposed even on parts of the top surfaces of the barriers 522_1. A second contact electrode stem CTE21 of the second contact electrode CTE2 may be in electrical contact with the second electrode stem RMT21 through the third holes HA3. The second contact electrode stem CTE21 may cover the second regions 524 and side surfaces of the barriers 522_1 and may extend outward to be disposed even on parts of the top surfaces of the barriers 522_1.

Figure 23:
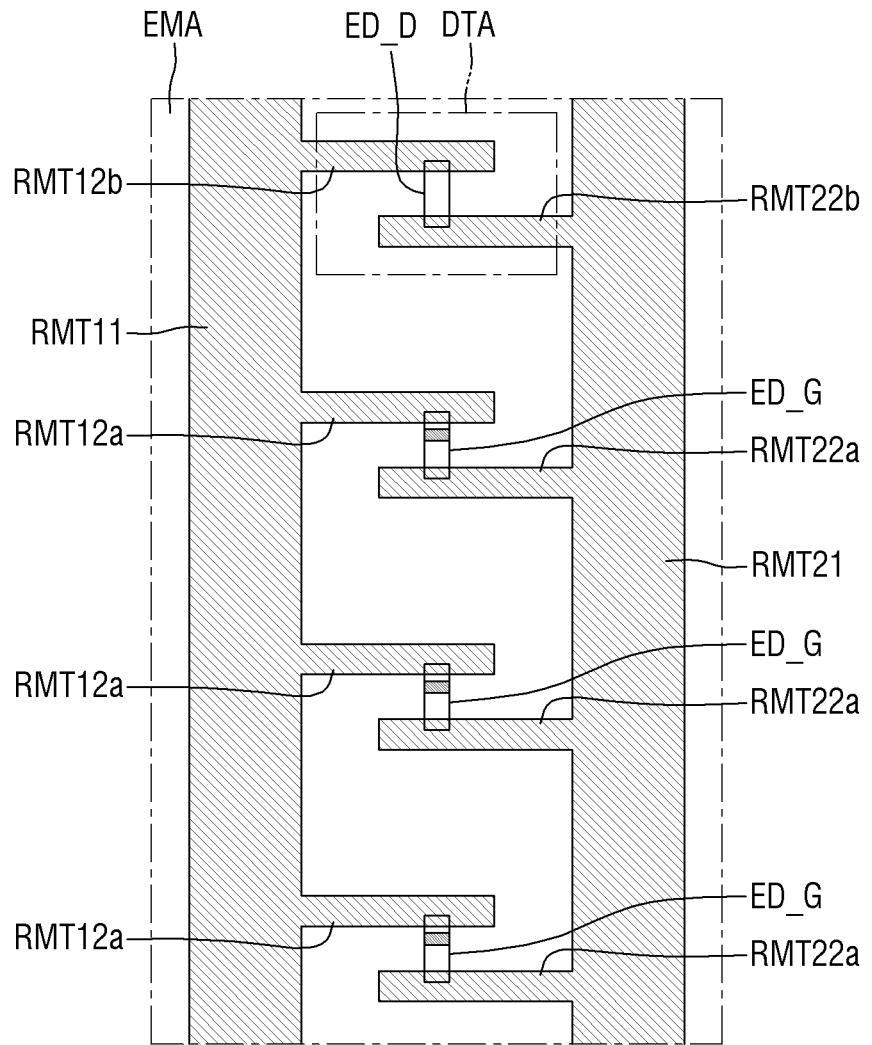
FIGS. 23 through 25 are schematic enlarged layout views illustrating a repair operation that may be performed in a case where a defect occurs in an emission area.
Figure 24:
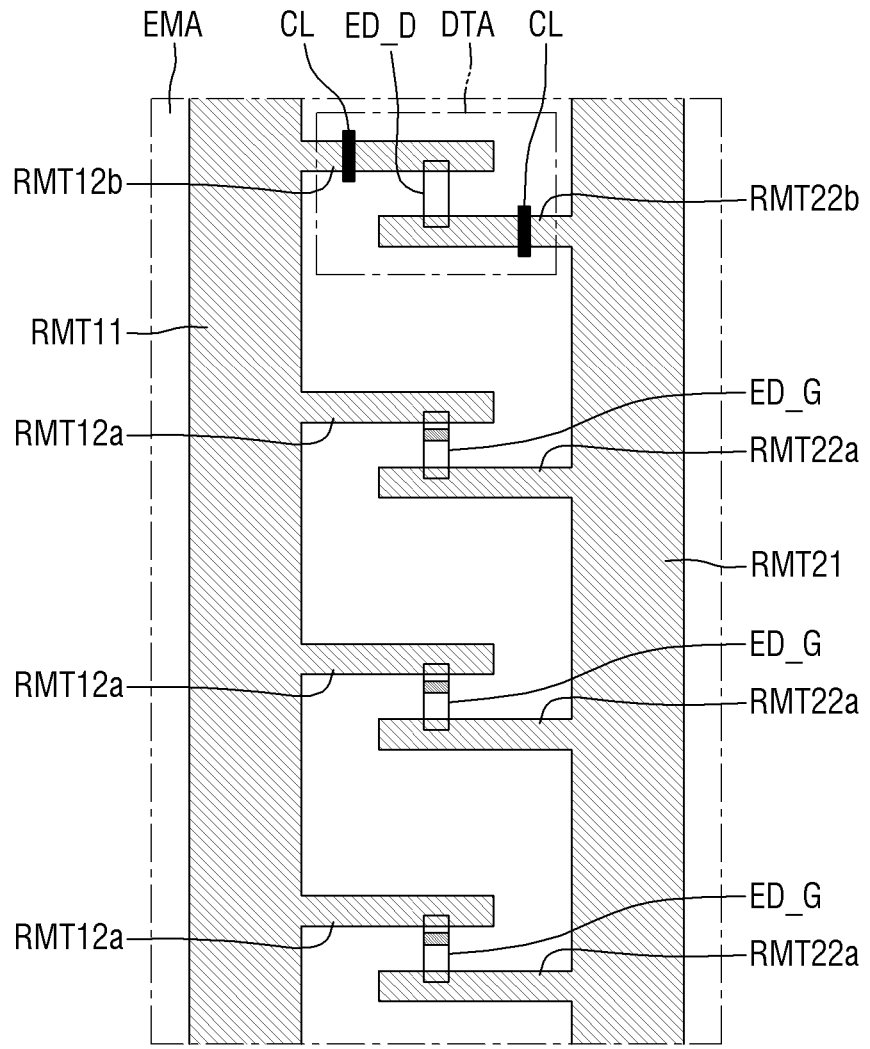
Figure 25:
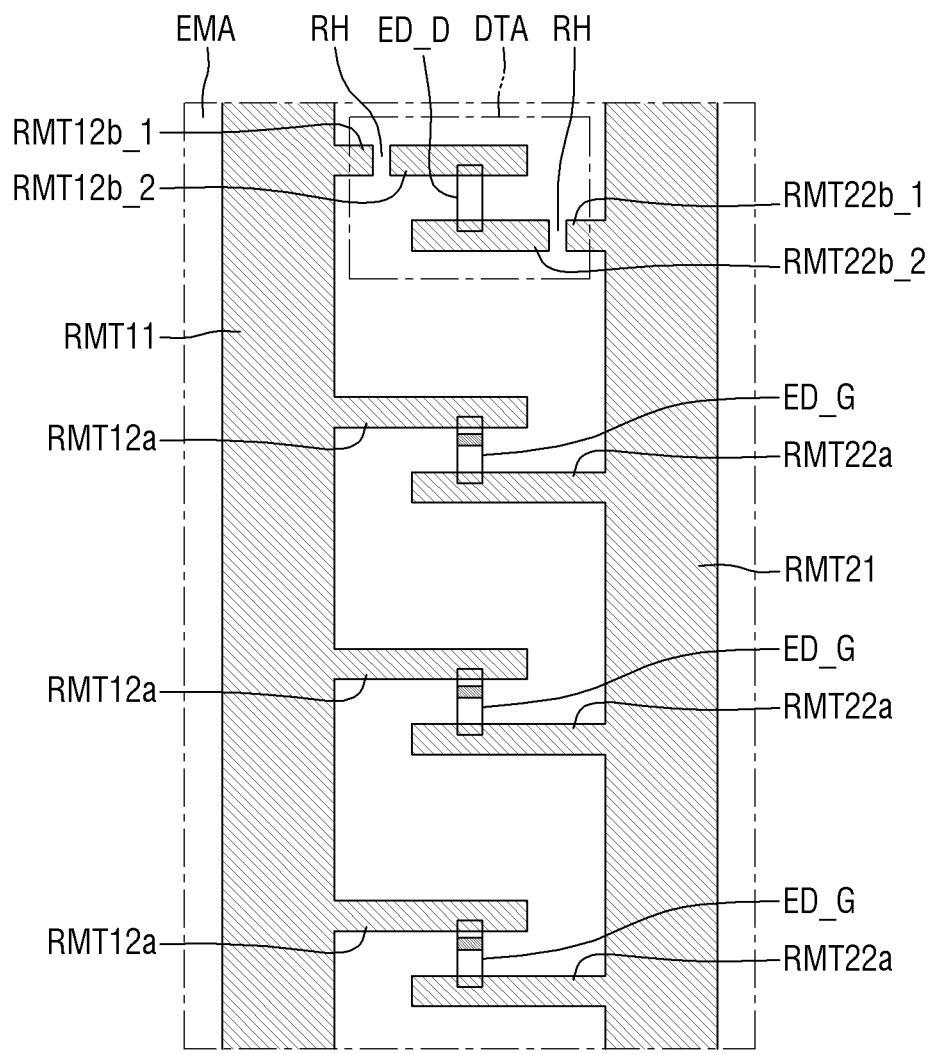

FIGS. 23 through 25 are schematic enlarged layout views illustrating a repair operation that may be performed in a case where a defect occurs in an emission area.

Referring to FIG. 23, light-emitting elements ED may include normal light-emitting elements ED_G and a defective light-emitting element ED_D. An emission area EMA may include a defective area DTA where the defective light-emitting element ED_D is disposed. For example, the defective light-emitting element ED_D may be a light-emitting element that is short-circuited or is already defective when fabricated.

A problem may arise if the defective light-emitting element ED_D is disposed between first and second electrode branches RMT12b and RMT22b of a unit branch. For example, in a case where the defective light-emitting element ED_D is disposed between first and second electrode branches RMT12b and RMT22b of a unit branch, a current that flows from a first electrode RMT1 to a second electrode RMT2 through the light-emitting elements ED may not flow through the normal light-emitting elements ED_G electrically connected to first and second electrode branches RMT12a and RMT 22a, but may flow through the defective light-emitting element ED_D. Thus, the normal light-emitting elements ED_G may not be able to emit light.

Thereafter, referring to FIG. 24, in a case where a display device includes the defective area DTA where the defective light-emitting element ED_D is disposed in a unit branch, at least one of first and second electrode branches RMT12b and RMT22b in the defective area DTA may be cut so that no current flows in the defective light-emitting element ED_D. For example, a defect may be repaired by cutting a region corresponding to at least one of cutting lines CL on the first and second electrode branches RMT12b and RMT22b. The cutting lines CL may be cut by laser.

Thereafter, referring to FIG. 25, in a case where at least one of the first and second electrode branches RMT12b and RMT22b is cut by laser, the first electrode branch RMT12b may be cut into two separate parts, i.e., a first electrode repair branch RMT12b_1 and a first pattern RMT12b_2. A gap RH between the first electrode repair branch RMT12b_1 and the first pattern RMT12b_2 may be a region corresponding to the cutting line CL on the first electrode branch RMT12b.

Similarly, the second electrode branch RMT22b may be cut into two separate parts, i.e., a second electrode repair branch RMT22b_1 and a second pattern RMT22b_2. A gap RH between the second electrode repair branch RMT22b_1 and the second pattern RMT22b_2 may be a region corresponding to the cutting line CL on the second electrode branch RMT22b.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
a first electrode disposed on a substrate;
a second electrode disposed on the substrate and spaced apart from the first electrode;
at least one light-emitting element extending in a second direction, disposed between the first electrode and the second electrode, and electrically connected to the first electrode and the second electrode; and
an insulating pattern layer disposed on the first electrode and the second electrode, the insulating pattern layer including:
a fixer disposed directly on at least part of the at least one light-emitting element; and
a barrier surrounding the at least one light-emitting element, the barrier directly contacting the fixer.

2. The display device of claim 1, wherein the insulating pattern layer includes an inorganic insulating material.

3. The display device of claim 1, wherein
the fixer and the barrier are integral with each other, and
the fixer extends across the barrier so as to make direct contact with the barrier.

4. The display device of claim 3, wherein
the insulating pattern layer includes holes which are completely surrounded by the fixer and the barrier, and
the holes include:
a first hole exposing a first end of the at least one light-emitting element; and
a second hole spaced apart from the first hole and exposing a second end of the at least one light-emitting element.

5. The display device of claim 4, further comprising:
a first contact electrode disposed on the insulating pattern layer, being in electrical contact with the first electrode and the first end of the at least one light-emitting element, and electrically connecting the first electrode and the at least one light-emitting element; and
a second contact electrode disposed on the insulating pattern layer, being in electrical contact with the second electrode and the second end of the at least one light-emitting element, and electrically connecting the second electrode and the at least one light-emitting element.

6. The display device of claim 5, wherein
the first contact electrode is in electrical contact with the first end of the at least one light-emitting element exposed by the first hole, and
the second contact electrode is in electrical contact with the second end of the at least one light-emitting element exposed by the second hole.

7. The display device of claim 1, wherein a thickness of the barrier is greater than a diameter of the at least one light-emitting element.

8. The display device of claim 7, wherein the thickness of the barrier is about 7500 Å to about 8500 Å.

9. The display device of claim 7, wherein a thickness of the fixer is equal to the thickness of the barrier.

10. The display device of claim 1, wherein an internal diameter of the barrier is greater than a length of the at least one light-emitting element in the second direction.

11. The display device of claim 10, wherein
a width of the fixer in the second direction is smaller than the length of the at least one light-emitting element in the second direction such that distal ends of the light-emitting element are exposed,
a length of the fixer in the first direction is larger than the width of the at least one light-emitting element in the first direction, and
the second direction is substantially perpendicular to the first direction.

12. The display device of claim 1, wherein the at least one light-emitting element and side surfaces of the barrier facing the at least one light-emitting element are spaced apart from each other.

13. The display device of claim 12, wherein side surfaces of the barrier are inclined with respect to a bottom surface of the barrier.

14. The display device of claim 13, wherein the side surfaces of the barrier are inclined at an angle of about 75° to about 85° with respect to the bottom surface of the barrier.

15. The display device of claim 13, further comprising:
a reflective layer disposed on the barrier.

16. The display device of claim 15, wherein the reflective layer is disposed on the side surfaces of the barrier.

17. The display device of claim 1, wherein
the first electrode includes:
a first electrode stem extending in the second direction; and
a plurality of first electrode branches extending from the first electrode stem in a first direction intersecting the second direction,
the second electrode includes:
a second electrode stem spaced apart from the first electrode stem in the first direction and extending in the second direction; and
a plurality of second electrode branches extending from the second electrode stem in the first direction, and
the plurality of first electrode branches and the plurality of second electrode branches are alternately arranged in the second direction.

18. The display device of claim 17, wherein
the at least one light-emitting element is disposed between at least one of the plurality of first electrode branches and at least one of the plurality of second electrode branches, and
the insulating pattern layer is disposed on the at least one of the plurality of first electrode branches and the at least one of the plurality of second electrode branches.

19. The display device of claim 17, wherein the second direction, which is an extension direction of the at least one light-emitting element, is substantially perpendicular to the first direction.

20. The display device of claim 19, wherein
the at least one light-emitting element includes:
a first semiconductor layer;
a second semiconductor layer; and
an active layer which is disposed between the first and second semiconductor layers, and
the first semiconductor layer, the active layer, and the second semiconductor layer are sequentially arranged in the direction in which the at least one light-emitting element extends.

* * * * *